US008673748B2

(12) United States Patent  
Matsumura et al.

(10) Patent No.: US 8,673,748 B2
(45) Date of Patent: Mar. 18, 2014

(54) METHOD FOR FABRICATING SEMICONDUCTOR THIN FILM USING SUBSTRATE IRRADIATED WITH FOCUSED LIGHT, APPARATUS FOR FABRICATING SEMICONDUCTOR THIN FILM USING SUBSTRATE IRRADIATED WITH FOCUSED LIGHT, METHOD FOR SELECTIVELY GROWING SEMICONDUCTOR THIN FILM USING SUBSTRATE IRRADIATED WITH FOCUSED LIGHT, AND SEMICONDUCTOR ELEMENT USING SUBSTRATE IRRADIATED WITH FOCUSED LIGHT

(75) Inventors: Hisashi Matsumura, Suita (JP); Shunro Fuke, Hamamatsu (JP); Yasuo Kanematsu, Suita (JP); Kazuyoshi Itoh, Suita (JP)

(73) Assignee: Osaka University, Osaka (JP)

( * ) Notice: Subject to any disclaimer, the term of this patent is extended or adjusted under 35 U.S.C. 154(b) by 260 days.

(21) Appl. No.: 13/254,668

(22) PCT Filed: Mar. 5, 2010

(86) PCT No.: PCT/JP2010/001571
§ 371 (c)(1),
(2), (4) Date: Sep. 2, 2011

(87) PCT Pub. No.: WO2010/100950
PCT Pub. Date: Sep. 10, 2010

(65) Prior Publication Data
US 2012/0001302 A1   Jan. 5, 2012

(51) Int. Cl.
*H01L 21/20* (2006.01)
(52) U.S. Cl.
USPC ........... 438/481; 257/103; 257/622; 438/341; 438/479

(58) Field of Classification Search
USPC .................... 257/103, 622; 438/341, 479, 481
See application file for complete search history.

(56) References Cited

U.S. PATENT DOCUMENTS

| 5,502,001 A | 3/1996 | Okamoto |
| 5,588,994 A * | 12/1996 | Bozler et al. ............... 117/89 |

(Continued)

FOREIGN PATENT DOCUMENTS

| JP | 02-181428 | 7/1990 |
| JP | 03-153014 | 7/1991 |

(Continued)

OTHER PUBLICATIONS

"Proceedings of the 68th Annual Conference of the Japan Society for Applied Physics," (Fall 2007 Hokkaido Institute of Technology 7a-ZR-6 p. 378) (Partial English Translation).

(Continued)

*Primary Examiner* — David Vu
*Assistant Examiner* — Brandon Fox
(74) *Attorney, Agent, or Firm* — Casimir Jones SC

(57) ABSTRACT

An apparatus (100) for fabricating a semiconductor thin film includes: substrate surface pretreatment means (101) for pretreating a surface of a substrate; organic layer coating means (102) for coating, with an organic layer, the substrate thus pretreated; focused light irradiation means (103) for irradiating, with focused light, the substrate coated with the organic layer, and for forming a growth-mask layer while controlling layer thickness; first thin film growth means (104) for selectively growing a semiconductor thin film over an area around the growth-mask layer; substrate surface treatment means (105) for, after exposing the surface of the substrate by removing the growth-mask layer, modifying the exposed surface of the substrate; and second thin film growth means (106) for further growing the semiconductor thin film and growing a semiconductor thin film over the modified surface of the substrate.

9 Claims, 24 Drawing Sheets

(56) References Cited

U.S. PATENT DOCUMENTS

| | | | |
|---|---|---|---|
| 5,973,785 A | 10/1999 | Okamoto | |
| 7,820,246 B2 | 10/2010 | Sumiya | |
| 7,847,293 B2 * | 12/2010 | Haskell et al. | 257/64 |
| 2007/0042560 A1 | 2/2007 | Sumiya | |
| 2007/0200708 A1 | 8/2007 | Hayama | |
| 2009/0065786 A1 | 3/2009 | Sumiya | |

FOREIGN PATENT DOCUMENTS

| | | |
|---|---|---|
| JP | 04-061116 | 2/1992 |
| JP | 05-002152 | 1/1993 |
| JP | 2003-101035 | 4/2003 |
| JP | 2003-189457 | 7/2003 |
| JP | 2005-026407 | 1/2005 |
| JP | 2005-84264 | 3/2005 |
| JP | 2006-265613 | 10/2006 |
| JP | 2007-228326 | 9/2007 |

OTHER PUBLICATIONS

International Search Report (and English translation) mailed Apr. 6, 2010, International Patent Application No. PCT/JP2010/001571.

Matsumura, H., et al., "Microfabrication of GaN groove . . . " (phys. Stat. sol.(C)3, No. 6, pp. 1649-1652 (2006)).

Matsumura, H., et al., "Selective growth of GaN on sapphire . . . " (Journal of Crystal Growth 310, 2008, pp. 5278-5281).

Takabe, M., et al., "HNO3 treatment of sapphire for management of GaN . . . " (Mat. Res. Soc. Symp. Proc. vol. 798, 2004, pp. 305-309).

Mita, S., et al., "Fabrication of a GaN lateral . . . " (Journal of Crystal Growth 311, 2009, pp. 3044-3048).

* cited by examiner

F I G. 2
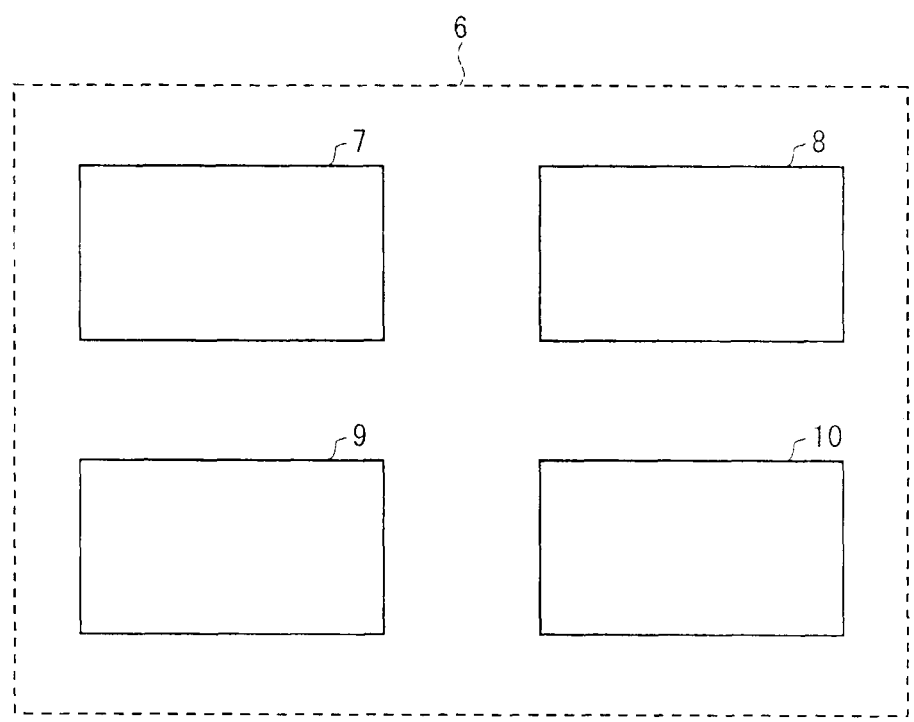

F I G. 3 (a)
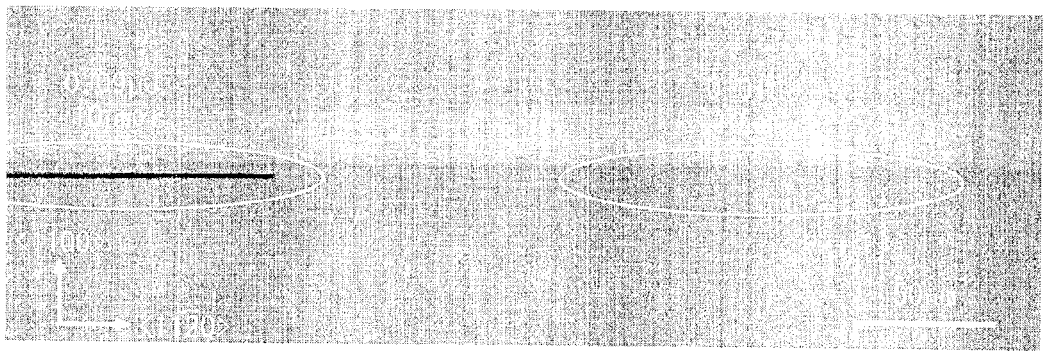
F I G. 3 (b)
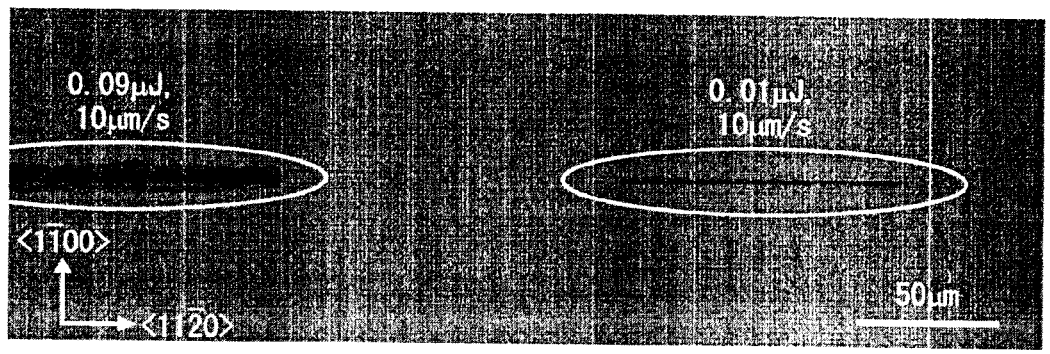

F I G. 4
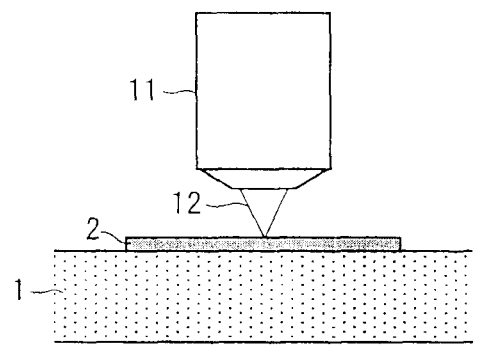

F I G. 6
FOCUSED LIGHT IRRADIATION ON SUBSTRATE SURFACE
0.01μJ/pulse
1μm/s
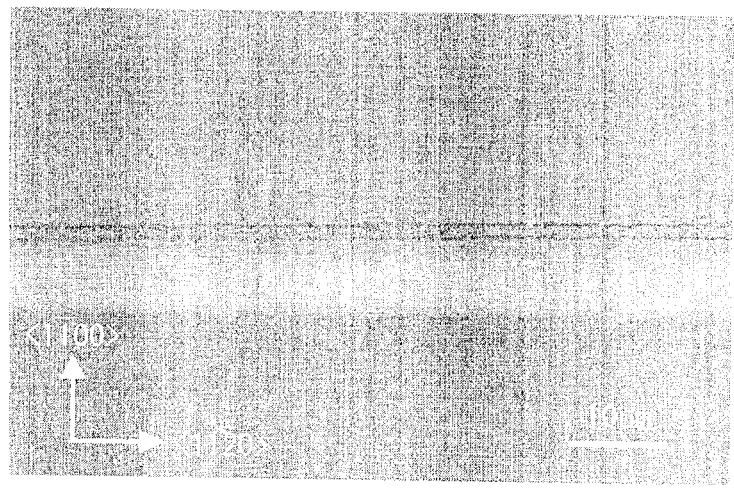

FOCUSED LIGHT IRRADIATION ON SUBSTRATE SURFACE
0.09μJ/pulse
10μm/s

FOCUSED LIGHT IRRADIATION ON SUBSTRATE SURFACE
0.01μJ/pulse
10μm/s

Ga-FACE POLARITY

N-FACE POLARITY

FIG. 10 (a)
INCOMPLETE SURFACE TREATMENT
(CARBON LAYER REMAINS)
ONLY LATERAL GROWTH OF Ga-FACE FILM
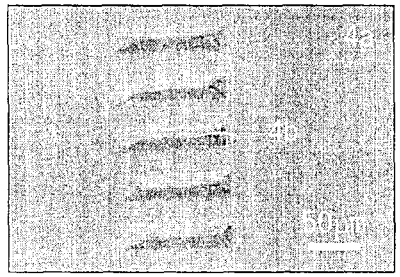
FIG. 10 (b)
ADEQUATE SURFACE TREATMENT
GROWTH ALTERNATED BETWEEN Ga-FACE FILM AND N-FACE FILM
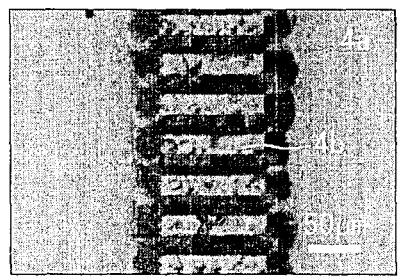
FIG. 10 (c)
EXCESSIVE SURFACE TREATMENT
DAMAGE TO SURFACE OF Ga-FACE REGION
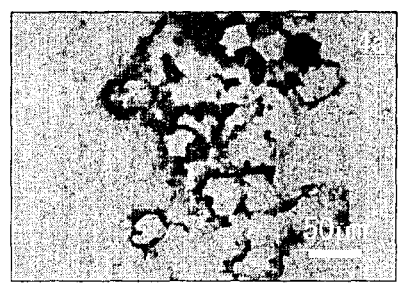

F I G. 1 6 (a)
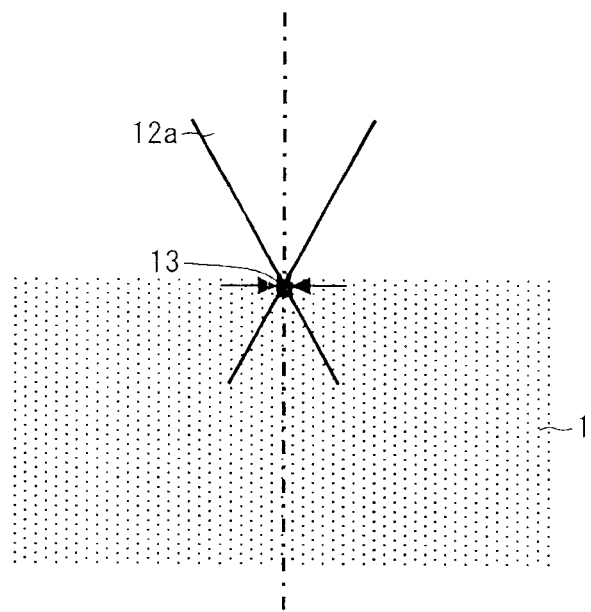
F I G. 1 6 (b)

F I G. 1 7 (a)
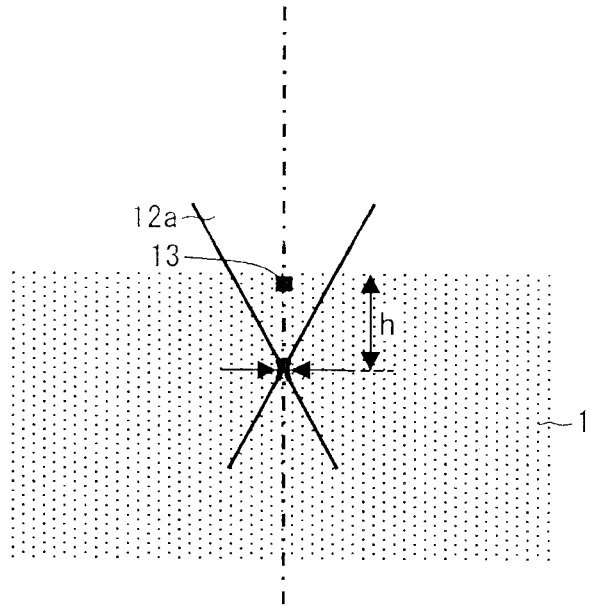
F I G. 1 7 (b)
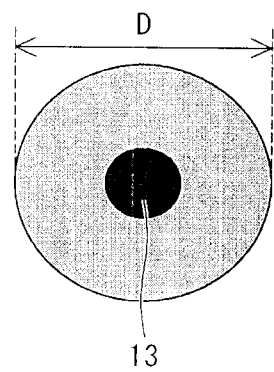

F I G. 1 9 (a)
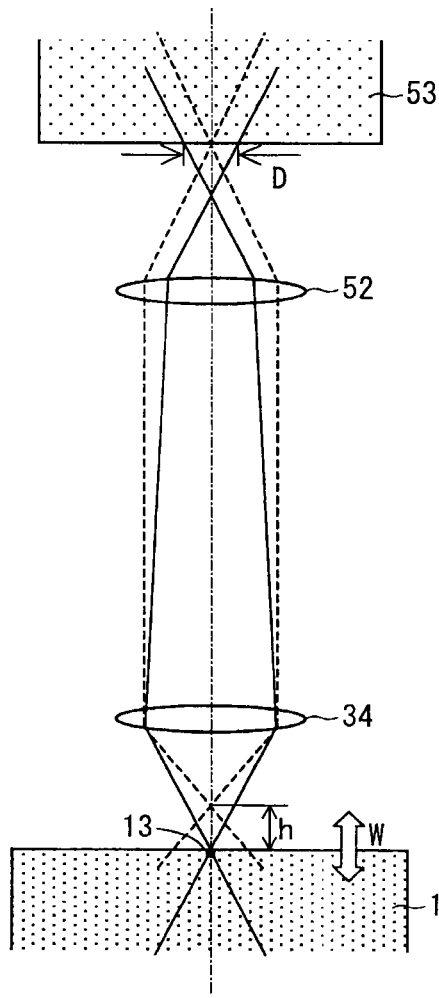
F I G. 1 9 (b)
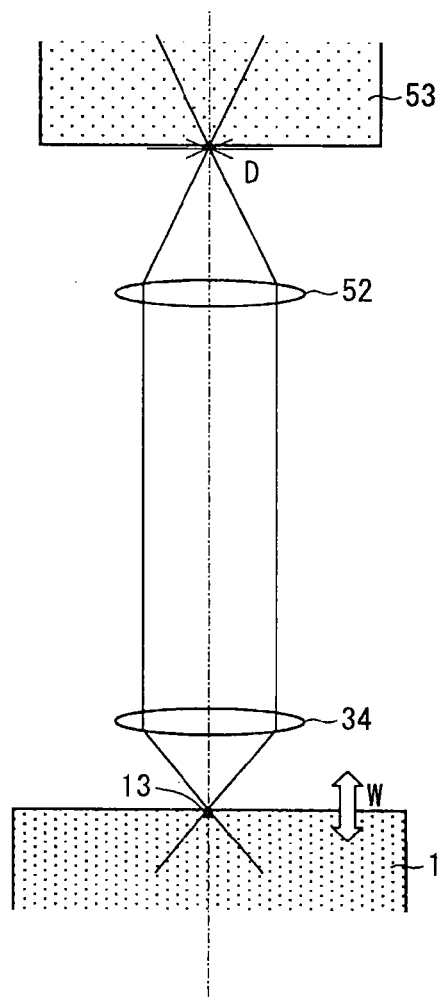
F I G. 1 9 (c)
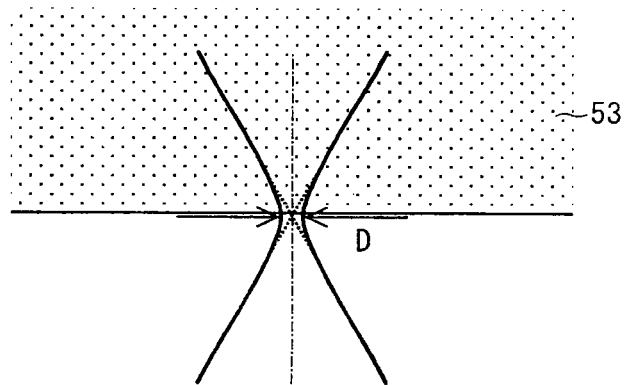

F I G. 2 2 (a)
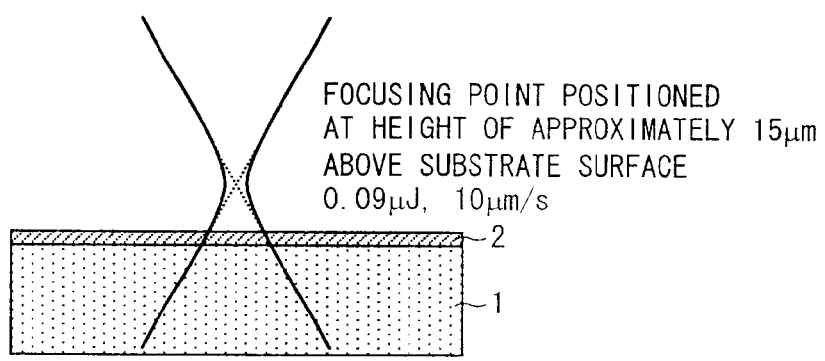
F I G. 2 2 (b)
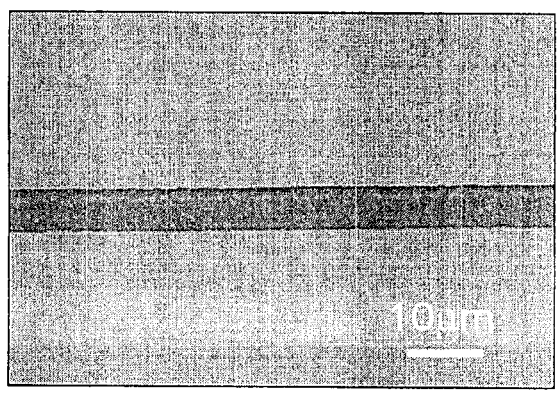

F I G. 2 3 (a)
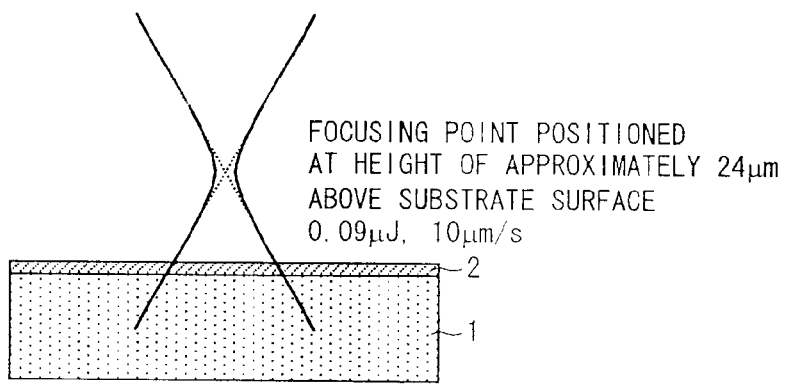
F I G. 2 3 (b)
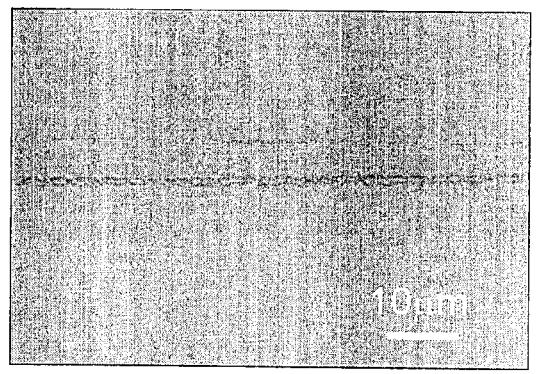

METHOD FOR FABRICATING SEMICONDUCTOR THIN FILM USING SUBSTRATE IRRADIATED WITH FOCUSED LIGHT, APPARATUS FOR FABRICATING SEMICONDUCTOR THIN FILM USING SUBSTRATE IRRADIATED WITH FOCUSED LIGHT, METHOD FOR SELECTIVELY GROWING SEMICONDUCTOR THIN FILM USING SUBSTRATE IRRADIATED WITH FOCUSED LIGHT, AND SEMICONDUCTOR ELEMENT USING SUBSTRATE IRRADIATED WITH FOCUSED LIGHT

CROSS REFERENCE TO RELATED APPLICATIONS

The present application is a U.S. 371 National Stage Entry of pending International Patent Application No. PCT/JP2010/001571, international filing date Mar. 5, 2010, which claims priority to JP Patent Application No. 2009-052574, the contents of which are incorporated by reference in their entireties.

TECHNICAL FIELD

The present invention relates to a method and apparatus for fabricating a semiconductor thin film while controlling a growth mode for each desired region after performing selective growth of a semiconductor thin film on a substrate.

BACKGROUND ART

It is known that the use of nonlinear optical media is effective in achieving wavelength conversion devices. In particular, in the case of using a noncentrosymmetric uniaxial crystal, it is essential, for the purpose of improving the nonlinear optical properties of the uniaxial crystal, to realize quasi-phase matching by achieving periodical inversion of crystallograhic orientation (polarity or polarization). Nitride semiconductors, such as gallium nitride (GaN), that have recently received more attention for semiconductor element application, etc. are also uniaxial crystals, and are expected to be utilized as nonlinear optical media. For this reason, the development of techniques for periodic inversion of polarity in nitride semiconductors is required.

So far there has been proposed a pattern formation process that controls polarity inversion and defines a region to be inverted by using molecular beam epitaxy (MBE) for GaN film growth.

Meanwhile, in the case of use of the metal organic chemical vapor deposition (MOCVD) method, which is more suitable for practical use, there has been a demand for a pattern formation process that can control polarity inversion and define a region to be inverted.

For example, Patent Literature 1 discloses a polarity inversion technique that form a semiconductor thin film with polarity inversion by growing a semiconductor thin film on a sapphire substrate treated with $HNO_3$ using a growth mask.

Further, Patent Literature 2 discloses, as an example of a polarity inversion technique based on electron beam irradiation of a substrate, a polarity inversion technique in which a sapphire substrate is treated in hydrogen at high temperatures, irradiated with an electron beam, and then deposited with a semiconductor thin film using metal organic chemical vapor deposition. Furthermore, Non-patent Literature 1 discloses a polarity inversion technique developed by improving the electron beam irradiation method.

CITATION LIST

Patent Literature 1
Japanese Patent Application Publication, Tokukai, No. 2005-026407 (Publication Date: Jan. 27, 2005)
Patent Literature 2
Japanese Patent Application Publication, Tokukai, No. 2006-265613 (Publication Date: Oct. 5, 2006)
Non-Patent Literature 1
Proceedings of the 68th Fall Meeting of the Japan Society for Applied Physics 7a-ZR-6

SUMMARY OF INVENTION

Technical Problem

However, in the case of the polarity inversion technique of Patent Literature 1, it is necessary to form a mask pattern on a substrate using a resist material, in order to obtain a semiconductor thin film having its polarities inverted for each desired region. For this reason, thermal treatment and wet treatment, which are indispensable during the step of handling such a resist material, degrade the effect of substrate surface treatment for semiconductor thin film growth.

Further, the polarity inversion techniques of Patent Literature 2 and Non-patent Literature 1, which deal with electron beams, require introduction of samples into ultrahigh-vacuum environments and require time for patterning.

The present invention has been made in view of the foregoing problems, and it is an object of the present invention to provide a method and apparatus for fabricating a semiconductor thin film while controlling a growth mode for each desired region, without the need for an etching step or an ultrahigh-vacuum environment that have conventionally been required in pattern formation. Further, it is another object of the present invention to provide a method for selectively growing a semiconductor thin film and a semiconductor element including a semiconductor thin film having its growth mode controlled for each desired region.

Solution to Problem

In order to solve the foregoing problems, an apparatus for fabricating a semiconductor thin film according to the present invention includes: substrate surface pretreatment means for pretreating a surface of a substrate; organic layer coating means for coating, with an organic layer, the substrate thus pretreated; focused light irradiation means for irradiating, with focused light, the substrate coated with the organic layer, and for forming a growth-mask layer while controlling layer thickness; first thin film growth means for selectively growing a semiconductor thin film over an area around the growth-mask layer; substrate surface treatment means for, after exposing the surface of the substrate by removing the growth-mask layer, modifying the exposed surface of the substrate; and second thin film growth means for further growing the semiconductor thin film and growing a semiconductor thin film on the modified surface of the substrate.

Further, in order to solve the foregoing problems, a method for fabricating a semiconductor thin film according to the present invention includes: coating a substrate with an organic layer; forming a growth-mask layer containing carbon species by irradiating, with focused light, the substrate coated with the organic layer; selectively growing a semiconductor thin film over an area around the growth-mask layer; exposing a surface of the substrate by removing the growth-mask layer; modifying the exposed surface of the substrate; and further growing the semiconductor thin film and growing a semiconductor thin film over the modified surface of the substrate.

According to the foregoing invention, after the surface of the substrate has been pretreated by the substrate surface pretreatment means, a desired region on the substrate coated with the organic layer by the organic layer coating means is irradiated with focused light by the focused light irradiation means. This leads to the formation of the growth-mask layer containing carbon species and having a growth-mask effect on the semiconductor thin film growth, thereby allowing selective growth of the semiconductor thin film by the first thin film growth means. Furthermore, the growth-mask layer can be removed, then the second thin film growth means allows a semiconductor thin film growth under a transformed growth mode over the modified surface of the substrate by growing a further semiconductor thin film after the substrate surface treatment means has removed the growth-mask layer and modified the exposed surface of the substrate.

The term "substrate surface modification" here means changing the properties of a surface of a substrate in order to transform the growth mode of a semiconductor thin film that grows on the surface of the substrate. That is, a semiconductor thin film is grown over the modified surface of the substrate under a transformed growth mode. The modification may be achieved by either (i) changing the properties by chemically transforming the substrate per se or (ii) changing the properties of the surface of the substrate by forming a thin film on the surface of the substrate. It should also be noted that the term "growth mode" refers, for example, to the presence or absence of growth-mask, growth orientation (such as polarity), crystal structure, etc.

Thus, the present invention allows forming a semiconductor thin film while controlling a growth mode for each desired region of a substrate, without the need for an etching step or an ultrahigh-vacuum environment required in conventional techniques.

Advantageous Effects of Invention

As described above, an apparatus for fabricating a semiconductor thin film according to the present invention includes: substrate surface pretreatment means for pretreating a surface of a substrate; organic layer coating means for coating, with an organic layer, the substrate thus pretreated; focused light irradiation means for irradiating, with focused light, the substrate coated with the organic layer, and for forming a growth-mask layer while controlling layer thickness; first thin film growth means for selectively growing a semiconductor thin film over an area around the growth-mask layer; substrate surface treatment means for, after exposing the surface of the substrate by removing the growth-mask layer, modifying the exposed surface of the substrate; and second thin film growth means for further growing the semiconductor thin film and growing a semiconductor thin film over the modified surface of the substrate.

Further, a method for fabricating a semiconductor thin film according to the present invention includes: coating a substrate with an organic layer; forming a growth-mask layer containing carbon species by irradiating, with focused light, the substrate coated with the organic layer; selectively growing a semiconductor thin film over an area around the growth-mask layer; exposing a surface of the substrate by removing the growth-mask layer; modifying the exposed surface of the substrate; and further growing the semiconductor thin film and growing a semiconductor thin film on the modified surface of the substrate.

This allows selective growth of a semiconductor thin film on a substrate without the need for an etching step. Further, this brings about an effect to offer an apparatus and method for fabricating a semiconductor thin film while controlling a growth mode for each desired region, without requiring ultra-high-vacuum environment, with a higher patterning speed as compared to a conventional method of electron beam irradiation.

BRIEF DESCRIPTION OF DRAWINGS

FIG. 1 shows cross-sectional views (a) through (h) to explain each step of a method for fabricating a semiconductor thin film according to Embodiment 1.

FIG. 2

FIG. 2 is a block diagram showing a configuration of an apparatus for fabricating a semiconductor thin film according to Embodiment 1.

FIG. 3(a)

FIG. 3(a) is a photograph of a surface of a sapphire substrate coated with an organic layer and irradiated with focused light pulses by varying irradiation conditions.

FIG. 3(b)

FIG. 3(b) is a photograph of a surface of a GaN film grown after cleaning of the sapphire substrate of FIG. 3(a).

FIG. 4

FIG. 4 is a side view showing how to irradiate, with focused light, an area near a surface of a sapphire substrate coated with an organic layer composed of an organic conducting layer, etc. in the focused light irradiation step of (c) of FIG. 1.

FIG. 5(a) is a side view showing the position (height) of a focusing point in the focused light irradiation step of (c) of FIG. 1 and showing irradiation with light focused inside the organic layer.

FIG. 5(b) is a side view showing the position (height) of a focusing point in the focused light irradiation step of (c) of FIG. 1 and showing irradiation with light focused on the interface between the organic layer and the sapphire substrate (i.e., on the surface of the sapphire substrate 1).

FIG. 5(c) is a side view showing the position (height) of a focusing point in the focused light irradiation step of (c) of FIG. 1 and showing irradiation with light focused inside the sapphire substrate.

FIG. 6

FIG. 6 is a photograph of a GaN film selectively grown on a sapphire substrate in the thin film growth step (I) of (e) of FIG. 1.

FIG. 7(a) is a photograph of a GaN film selectively grown on a sapphire substrate 1 whose surface has been irradiated with focused light pulses at 0.09 µJ/pulse with a translation speed of 10 µm/s in the focused light irradiation step of (c) of FIG. 1.

FIG. 7(b) is a photograph of a GaN film selectively grown on a sapphire substrate 1 whose surface has been irradiated with focused light pulses at 0.01 µJ/pulse with a translation speed of 10 µm/s in the focused light irradiation step of (c) of FIG. 1.

FIG. 8 is a perspective view of a periodical polarity inverted structure of a GaN film according to Embodiment 1.

FIG. 9(a) shows a crystal structure of a GaN film according to Embodiment 1, in particular, a crystal structure of a GaN film with Ga-face (+c) polarity.

FIG. 9(b) shows a crystal structure of a GaN film according to Embodiment 1, in particular a crystal structure of a GaN film with N-face (−c) polarity.

FIG. 10(a)

FIG. 10(a) is a planimetric photograph of a GaN film obtained when the substrate surface has been insufficiently treated in the substrate surface treatment step of (f) of FIG. 1.

FIG. 10(b)

FIG. 10(b) is a planimetric photograph of a GaN film obtained when the substrate surface has been adequately treated in the substrate surface treatment step of (f) of FIG. 1.

FIG. 10(c)

FIG. 10(c) is a planimetric photograph of a GaN film obtained when the substrate surface has been excessively treated in the substrate surface treatment step of (f) of FIG. 1.

FIG. 11 is a plan view of an optical integrated circuit having a wavelength conversion element including a semiconductor thin film fabricated by the method for fabricating a semiconductor thin film according to Embodiment 1.

FIG. 12 shows cross-sectional views (a) through (h) to explain a method for fabricating a semiconductor thin film according to Embodiment 2.

FIG. 13 is a block diagram showing a configuration of an apparatus for fabricating a semiconductor thin film according to Embodiment 3.

FIG. 14 is a block diagram showing a configuration of the focused light irradiation means of FIG. 13.

FIG. 15(a) is a cross-sectional view obtained when the focusing lens has its focal point above a surface of a sapphire substrate.

FIG. 15(b) shows an optical image of a reference dot formed on the surface of the substrate, which would be obtained in the case of FIG. 15(a) by the image pickup element of FIG. 14.

FIG. 16(a)

FIG. 16(a) is a cross-sectional view obtained when the focusing lens has its focal point on a surface of a sapphire substrate.

FIG. 16(b)

FIG. 16(b) shows an optical image of a reference dot formed on the surface of the sapphire substrate, which would be obtained in the case of FIG. 16(a) by the image pickup element of FIG. 14.

FIG. 17(a)

FIG. 17(a) is a cross-sectional view obtained when the focusing lens has its focal point below a surface of a sapphire substrate.

FIG. 17(b)

FIG. 17(b) shows an optical image of a reference dot formed on the surface of the sapphire substrate, which would be obtained in the case of FIG. 17(a) by the image pickup element of FIG. 14.

FIG. 18 is a graph showing a relationship between the height h of the focal point of the focusing lens with respect to a surface of a sapphire substrate and the diameter D of an optical image of a reference dot formed on the surface of the sapphire substrate.

FIG. 19(a)

FIG. 19(a) is a cross-sectional view showing how an image is formed onto an image pickup element when the sapphire substrate of FIG. 15(a) is wobbled vertically in the direction normal to the surface of the substrate.

FIG. 19(b)

FIG. 19(b) is a cross-sectional view showing how an image is formed onto an image pickup element when the sapphire substrate of FIG. 16(a) is wobbled vertically in the direction normal to the surface of the substrate.

FIG. 19(c)

FIG. 19(c) is an enlarged cross-sectional view of a light-receiving surface of the image pickup element of FIG. 19(b).

FIG. 20(a) is a graph showing an output signal that is converted by the image pickup element during vertical wobbling corresponding to FIG. 19(a).

FIG. 20(b) is a graph showing an output signal that is converted by the image pickup element during vertical wobbling corresponding to FIG. 19(b).

FIG. 21(a) is a cross-sectional view showing focused light irradiation performed in a case where the focusing lens has its focal point on a surface of a sapphire substrate.

FIG. 21(b) is a photograph of a surface of a GaN film selectively grown on a surface of a sapphire substrate irradiated with focused light under the condition of FIG. 21(a).

FIG. 22(a)

FIG. 22(a) is a cross-sectional view showing focused light irradiation performed in a case where the focusing lens has its focal point at a height of approximately 15 µm above a surface of a sapphire substrate.

FIG. 22(b)

FIG. 22(b) is a photograph of a surface of a GaN film selectively grown on a surface of a sapphire substrate irradiated with focused light under the condition of FIG. 22(a).

FIG. 23(a)

FIG. 23(a) is a cross-sectional view showing focused light irradiation performed in a case where the focusing lens has its focal point at a height of approximately 24 µm above a surface of a sapphire substrate.

FIG. 23(b)

FIG. 23(b) is a photograph of a surface of a GaN film selectively grown on a surface of a sapphire substrate irradiated with focused light under the condition of FIG. 23(a).

FIG. 24 is a cross-sectional view of a configuration of the substrate surface treatment means of FIG. 13.

FIG. 25(a) is a planimetric photograph of a GaN film having a periodical polarity inverted structure according to an example.

FIG. 25(b) is a partially-enlarged photograph of the GaN film having a periodical polarity inverted structure of FIG. 25(a).

FIG. 25(c) is a partially-enlarged photograph of the GaN film having a periodical polarity inverted structure of FIG. 25(b).

DESCRIPTION OF EMBODIMENTS

[Embodiment 1]

An embodiment of the present invention is described below with reference to FIGS. 1 through 11. In Embodiment 1, a case is described where a gallium nitride (GaN) thin film having a periodical polarity inverted structure is formed on a substrate by a method for fabricating a semiconductor thin film according to the present invention.

Figure 1:
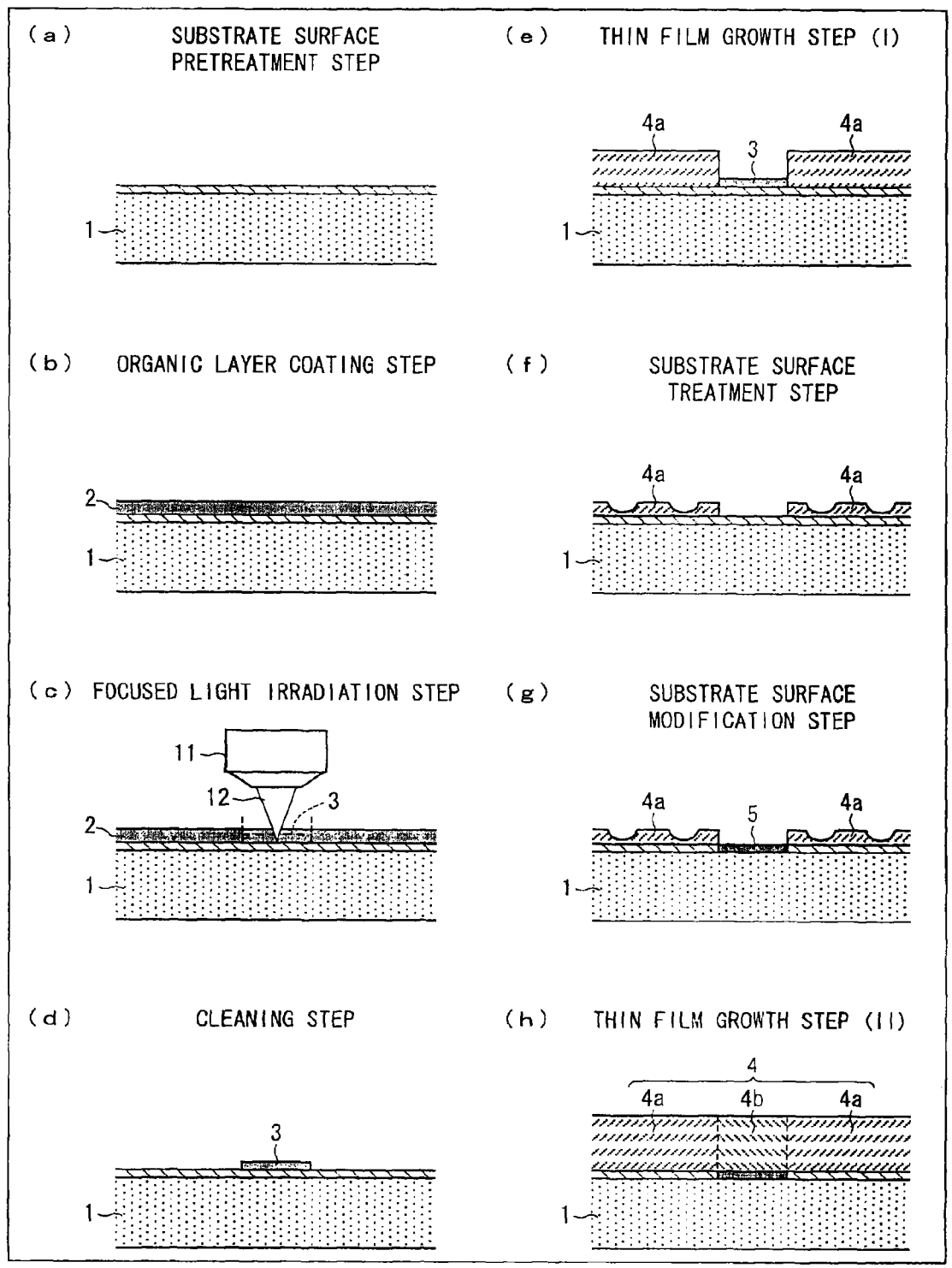
FIG. 1
Figure 5:
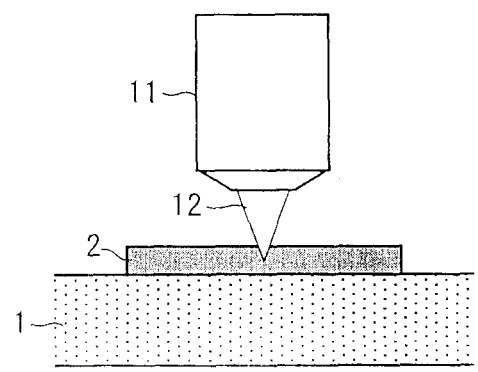
FIG. 5(a)
FIG. 5(b)
FIG. 5(c)
Figure 5:
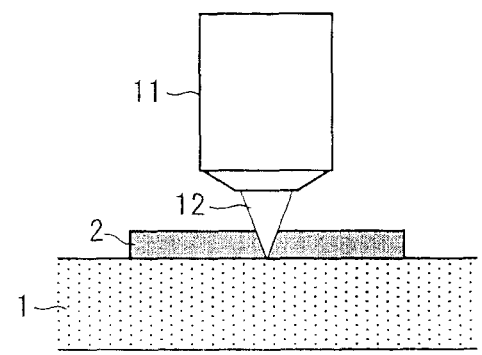
Figure 5:
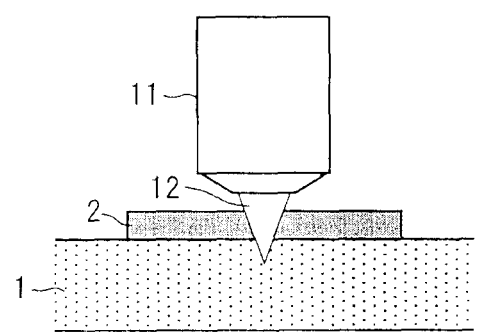
Figure 7:
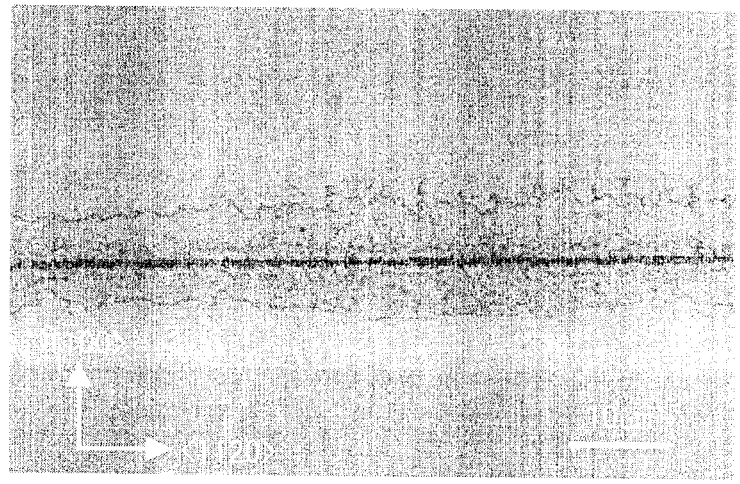
FIG. 7(a)
FIG. 7(b)
Figure 7:
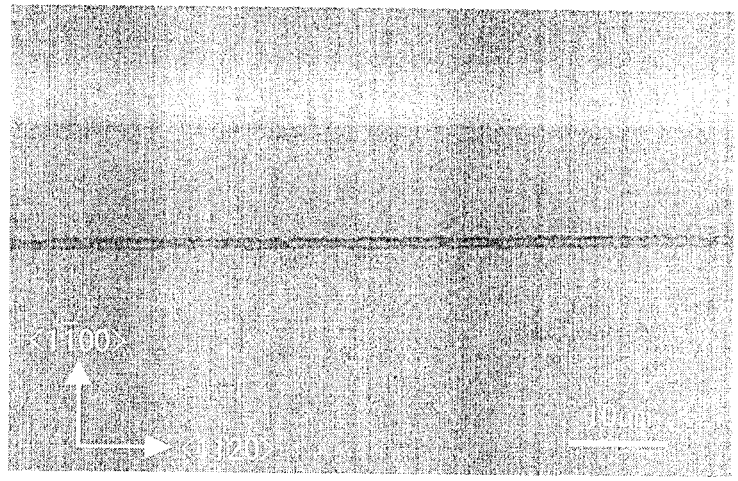

FIG. 1 shows cross-sectional views (a) through (h) to explain a method for fabricating a semiconductor thin film 4 according to Embodiment 1. FIG. 2 is a block diagram showing a configuration of an apparatus 6 for fabricating a semiconductor thin film according to Embodiment 1. As shown in FIG. 2, the apparatus 6 for fabricating a semiconductor thin film includes substrate surface pretreatment means 7, focused light irradiation means 8, thin film growth means 9, and substrate surface treatment means 10.

The substrate surface pretreatment means 7 is means for pretreating a surface of a substrate to facilitate semiconductor thin film growth and, in Embodiment 1, allows treatment of a sapphire ($Al_2O_3$) substrate 1 in hydrogen at high temperatures.

The focused light irradiation means 8 is means for irradiating, with focused light pulses, the sapphire substrate 1 treated in hydrogen at high temperatures by the substrate surface pretreatment means 7. The light utilized during focused light irradiation by the focused light irradiation means 8 may be continuous-wave light and is not limited to light pulses.

The thin film growth means 9 is means for selectively growing a semiconductor thin film 4 on the sapphire substrate 1 after performing focused light irradiation and cleaning.

The substrate surface treatment means 10 is means for modifying the surface of the sapphire substrate 1 on which the semiconductor thin film 4 has been selectively grown. It should be noted that the substrate surface pretreatment means 7, the thin film growth means 9, and the substrate surface treatment means 10 are equipment that treat the surface of the substrate 1 in a gaseous atmosphere including a reactant gas. For this reason, the substrate surface pretreatment means 7, the thin film growth means 9, and the substrate surface treatment means 10 may be identical means.

As shown in (a) through (h) of FIG. 1, the method for fabricating a semiconductor thin film according to Embodiment 1 includes (a) a substrate surface pretreatment step, (b) an organic layer coating step, (c) a focused light irradiation step, (d) a cleaning step, (e) a thin film growth step (I), (f) a substrate surface treatment step, (g) a substrate surface modification step, and (h) a thin film growth step (II).

First, in the substrate surface pretreatment step, as shown in (a) of FIG. 1, the sapphire substrate 1 is treated in hydrogen at high temperatures (approximately 1,060° C.) for 10 minutes at near-atmospheric pressure in the substrate surface pretreatment means 7 of FIG. 2. This allows the epitaxial growth of a GaN film 4 on the sapphire substrate 1. It should be noted that the substrate surface pretreatment step can be skipped when necessary.

Next, in the organic layer coating step, the sapphire substrate 1 is transferred from the substrate surface pretreatment means 7 to atmosphere and the sapphire substrate 1 is coated with an organic layer 2, as shown in (b) of FIG. 1. Usable examples of the organic layer 2 include poly(isothianaphthenediyl-sulfonate) (ESPACER 300Z; manufactured by Showa Denko K.K.; composed mainly of the organic polymer named just above), etc.

Then, in the focused light irradiation step, as shown in (c) of FIG. 1, femtosecond light pulses (light) 12 (e.g., which has a center wavelength of 800 nm, a pulse width of approximately 100 fs, and a repetition rate of 1 kHz) from a titanium sapphire regenerative amplifier are focused with a focusing lens 11 by the focused light irradiation means 8 of FIG. 2, and the sapphire substrate 1 coated with the organic layer 2 is irradiated with the femtosecond light pulses 12 thus focused. In this step, a carbon layer (growth-mask layer) 3 containing carbon species constituting the organic layer 2 is formed with a thickness of several nanometers over a region irradiated with the light pulses 12. The carbon layer 3 has an effect of suppressing (masking) the growth of the semiconductor thin film 4, and has an effect equivalent to that of a growth-mask.

It should be noted here that use of an objective lens as the focusing lens 11 reduces the aberration effect. Further, the higher numerical aperture the focusing lens 11 has, the tighter the focusing point can be spatially confined. This focusing point (focused spot) is translated over the surface of the sapphire substrate 1 or an area near the surface of the sapphire substrate 1 for patterning.

Although the titanium sapphire regenerative amplifier has been taken as an example of the source of the light pulses 12, this does not imply any limitation. Besides the titanium sapphire regenerative amplifier, various light sources such as an optical parametric amplifier can possibly be used. The term "light pulses" here means light that has a pulse width of several tens of nanoseconds to several femtoseconds. Although light pulses are used in Embodiment 1, this does not imply any limitation. For example, laser light such as a semiconductor laser can be used. In Embodiment 1, the term "laser light" means laser light that has a wavelength range where it can interact with the substrate or the organic film in a multiphoton process or in a direct process.

Then, in the cleaning step, the sapphire substrate treated with focused light irradiation (substrate irradiated with focused light) is cleaned in a solvent such as purified water, whereby as shown in (d) of FIG. 1 the organic layer 2 is removed for the region without irradiation with the light pulses 12, while the carbon layer 3 remains on the sapphire substrate 1 only for the region irradiated with the light pulses 12.

Then, in the thin film growth step (I), as shown in (e) of FIG. 1, a GaN film 4a with Ga-face (+c) polarity is grown on the sapphire substrate 1 using metal organic chemical vapor deposition (MOCVD) or the like in the thin film growth means 9 of FIG. 2. To maintain the growth-mask effect for the carbon layer 3, it is preferable that the GaN film 4a should be grown by starting deposition of a low-temperature buffer layer and a high-temperature GaN film without treating the sapphire substrate 1 in hydrogen at high temperatures. Then a surface with the carbon layer 3 formed by focused light irradiation corresponds to a region where the growth of the GaN film 4a is suppressed, thus allowing growth of the GaN film 4a with Ga-face polarity only for the region that was not irradiated with focused light (i.e., for the region without the carbon layer 3). In this way, the GaN film 4a with Ga-face polarity can be formed for each desired region on the sapphire substrate 1 through the substrate surface pretreatment step, the organic layer coating step, the focused light irradiation step, the cleaning step, and the thin film growth step (I) (selective growth).

By varying the growth conditions of the GaN film 4a (reactor pressure, growth temperature, and V/III ratio) and the pattern written by the light pulses 12 (orientation, fill factors; ratio of opening width to period for periodically patterned growth-masks), a side facet of the GaN film 4a can be controlled (i.e., a sidewall of the GaN film 4a can be controlled so that it has a vertical profile or an inclined profile).

Then, in the substrate surface treatment step, the sapphire substrate 1 is treated in hydrogen at high temperatures (approximately 1,040° C.) for 1 minute 45 seconds at near-atmospheric pressure in the substrate surface treatment means 10 of FIG. 2, whereby as shown in (f) of FIG. 1 the carbon layer 3 can be removed from the sapphire substrate 1. For a conventional growth-mask layer based on silicon dioxide ($SiO_2$) or tungsten (W), it is difficult to remove the growth-mask layer once the growth-mask layer has been formed on a substrate. On the other hand, in Embodiment 1, the carbon layer 3, which has a growth-mask effect on the growth of the semiconductor thin film 4, can be removed even after the formation over the sapphire substrate 1. This allows switching between the presence and absence of the growth-mask effect, thus introducing a difference in time of the beginning of thin-film growth for each desired region on the sapphire substrate 1.

Then, in the substrate surface modification step, the surface of the sapphire substrate 1 is treated in mixed hydrogen and ammonia (at near-atmospheric pressure in total) for 5 minutes at approximately 1,040° C. in the substrate surface treatment means 10 of FIG. 2, whereby as shown in (g) of FIG. 1 that surface of the sapphire substrate 1 which has been exposed in the substrate surface treatment step is nitrided to form a modified surface 5. It should be noted that the substrate surface treatment step and the substrate surface modification step can be executed in the identical substrate surface treatment means 10. This allows reduction in the number of steps.

Finally, in the thin film growth step (II), as shown in (h) of FIG. 1, the GaN film 4 is re-grown in the thin film growth means 9 of FIG. 2. In this step, the GaN film 4a with Ga-face polarity is continuously grown on the sapphire substrate 1. Meanwhile, a GaN film 4b with N-face (−c) polarity is grown on the nitrided modified-surface 5 surrounded by GaN films 4a with Ga-face polarity. This leads to the formation of the GaN film 4b with N-face (−c) polarity within the GaN film 4a with Ga-face polarity, thus allowing the alternate inversion of the polarity for a GaN film 4 (4a, 4b) as desired.

FIGS. 3(a) and 3(b) are photographs for explaining the selective growth of a GaN film 4a using a sapphire substrate 1 according to Embodiment 1. FIG. 3(a) is a photograph of a surface of a sapphire substrate 1 coated with an organic layer 2 and irradiated with focused light pulses by varying irradiation conditions. Further, FIG. 3(b) is a photograph of a surface of a GaN film 4a grown after cleaning of the sapphire substrate 1 of FIG. 3(a). When a surface of the sapphire substrate 1 coated with the organic layer 2 is irradiated with focused light (femtosecond light pulses) with a pulse width of approximately 100 femtoseconds at a pulse energy of 0.09 µJ/pulse and a translation speed of 10 µm/s in the focused light irradiation step, there occurs ablation of the sapphire substrate 1, as shown on the left-hand side of FIG. 3(a), so that the sapphire substrate 1 is scarred. If a GaN film 4a is grown, after cleaning, on such a sapphire substrate 1, a GaN film 4 can be selectively grown over an area around the scar as shown on the left-hand side of FIG. 3(b). However, the GaN film 4a grown on the area around the scar exhibits irregular edges. On the other hand, when the surface of the sapphire substrate is irradiated with focused femtosecond light pulses at a pulse energy of 0.01 µJ/pulse and a translation speed of 10 µm/s, the sapphire substrate 1 is not scarred, as shown on the right-hand side of FIG. 3(a). Furthermore, as shown on the right-hand side of FIG. 3(b), a GaN film 4a can be selectively grown over an area around the region irradiated with focused light (carbon layer 3) without irregular edges.

By thus adjusting the conditions of irradiation with the light pulses 12 in the focused light irradiation step and thereby forming the carbon layer 3 without requiring a scar or a trench structure on the sapphire substrate 1, the GaN film 4a can be selectively grown in adequate conditions.

FIG. 4 is a side view showing how to irradiate, with focused light, an area near a surface of a sapphire substrate 1 coated with an organic layer 2 in the focused light irradiation step of (c) of FIG. 1. The organic layer 2 may contain an organic conducting material. Thus, in the focused light irradiation step, by irradiating the sapphire substrate 1 with the light pulses 12 focused by the focusing lens (objective lens) 11, the carbon layer 3 can be formed for each desired region on the sapphire substrate 1.

FIGS. 5(a) through 5(c) are each a side view showing the position (height) of a focusing point in the focused light irradiation step of (c) of FIG. 1. FIG. 5(a) shows irradiation with focused light inside the organic layer 2. FIG. 5(b) shows irradiation with focused light on the interface between the organic layer 2 and the sapphire substrate 1 (i.e., on the surface of the sapphire substrate 1). FIG. 5(c) shows irradiation with focused light inside the sapphire substrate 1. The sapphire substrate 1 coated with the organic layer 2 in the organic layer coating step may be irradiated with the focused light pulses 12 in the focused light irradiation step through irradiation with the light pulses 12 focused inside the organic layer 2 as shown in FIG. 5(a), focused on the interface between the organic layer 2 and the sapphire substrate 1 as shown in FIG. 5(b), or focused inside the sapphire substrate 1 as shown in FIG. 5(c). Thus, the position of a focusing point of the light pulses 12 with respect to the sapphire substrate 1 may be appropriately varied depending on the conditions of irradiation with the light pulses 12.

FIG. 6 is a photograph of a GaN film 4a selectively grown on a sapphire substrate 1 in the thin film growth step (I) of (e) of FIG. 1. As shown in FIG. 6, in the thin film growth step (I), the GaN film 4a is not grown over the carbon layer 3 but is selectively grown on an area around the carbon layer 3. Since the carbon layer 3, which suppresses the growth of the GaN film 4a, can be formed by irradiating, with the focused light pulses 12, a desired region on the sapphire substrate 1 coated with the organic layer 2, the GaN film 4a can be selectively grown on a desired region of the sapphire substrate 1.

FIG. 7(a) is a photograph of a GaN film 4a selectively grown on a sapphire substrate 1 whose surface has been irradiated with focused light pulses at 0.09 µJ/pulse with a translation speed of 10 µm/s in the focused light irradiation step of (c) of FIG. 1. FIG. 7(b) is a photograph of a GaN film 4a selectively grown on a sapphire substrate 1 whose surface has been irradiated with focused light pulses at 0.01 µJ/pulse with a translation speed of 10 µm/s in the focused light irradiation step of (c) of FIG. 1. If the pulse energy is too high in the focused light irradiation step, there occurs ablation on a surface of the sapphire substrate 1 so that the surface of the sapphire substrate 1 is scarred. For this reason, a surface of the selectively grown GaN film 4a exhibits irregular edges as shown in FIG. 7(a). On the other hand, if the pulse energy is too low, the carbon layer 3 cannot bring about a sufficient growth-mask effect. Therefore, by optimizing the pulse energy, the selective growth of a GaN film 4a can be achieved in adequate conditions as shown in FIG. 7(b).

Further, even for the same level of pulse energy, the effect of focused light irradiation decreases as the translation speed is increased, and the effect of focused light irradiation increases as the translation speed is decreased. Furthermore, even for the same level of pulse energy, the effect of focused light irradiation decreases as the focusing point gets further and further away from the surface of the sapphire substrate 1, and increases as the focusing point gets closer and closer to the surface of the sapphire substrate 1. Therefore, it is necessary to appropriately optimize the pulse energy, the translation speed, the position of the focusing point, etc. depending on the numerical aperture of the focusing lens 11 and the conditions of irradiation with the light pulses 12.

Figure 8:
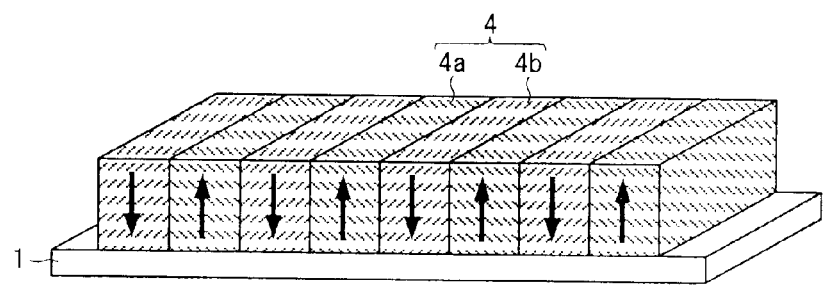
FIG. 8
Figure 9:
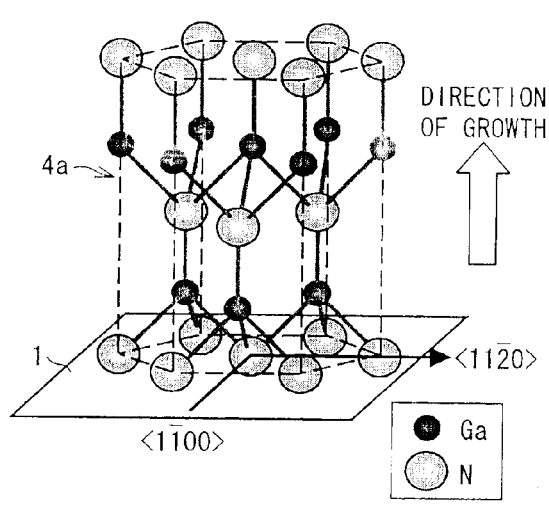
FIG. 9(a)
FIG. 9(b)
Figure 9:
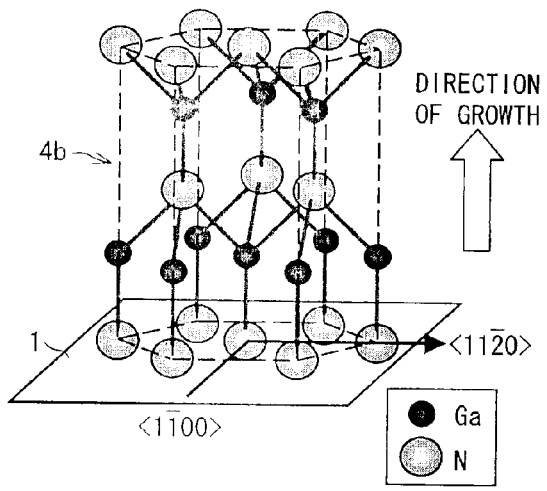

FIG. 8 is a perspective view of a periodical polarity inverted structure of a GaN film 4 according to Embodiment 1. As shown in FIG. 8, the GaN film 4 has GaN films 4a with Ga-face polarity and GaN films 4b with N-face polarity formed alternately and periodically along a long side of the sapphire substrate 1. It should be noted that the GaN films 4b with N-face polarity are each formed on a region irradiated with the focused light pulses 12 in the focused light irradiation step. For this reason, by controlling a region to be irradiated with the focused light pulses 12, a GaN film 4b with N-face (−c) polarity can be formed for each desired region on the sapphire substrate 1.

FIG. 9(a) shows a crystal structure of a GaN film 4 according to Embodiment 1, in particular, a crystal structure of a GaN film 4a with Ga-face (+c) polarity. FIG. 9(b) shows a crystal structure of a GaN film 4 according to Embodiment 1, in particular a crystal structure of a GaN film 4b with N-face (−c) polarity.

Since the crystal structure of each of the GaN films 4 is uniaxial, the GaN films 4 can have alternate inversion of crystal structure (flip at 180 degrees) as shown in FIGS. 9(a) and 9(b). For this reason, the nonlinear optical coefficients of the GaN film 4a with Ga-face (+c) polarity and the GaN film 4b with N-face (−c) polarity are of opposite sign.

FIGS. 10(a) through 10(c) are each a plan view showing the effects of the substrate surface treatment step of (f) of FIG. 1. FIG. 10(a) shows a semiconductor thin film 4 obtained when the substrate surface has been insufficiently treated in the substrate surface treatment step. FIG. 10(b) shows a semiconductor thin film 4 obtained when the substrate surface has been adequately treated in the substrate surface treatment step. FIG. 10(c) shows a semiconductor thin film 4 obtained when the substrate surface has been excessively treated in the substrate surface treatment step. In Embodiment 1, in the substrate surface treatment step, as mentioned above, the sapphire substrate 1 is treated in hydrogen at high temperatures (approximately 1,040° C.) for 1 minute 45 seconds at near-atmospheric pressure, whereby the carbon layer 3 formed on the sapphire substrate 1 can be appropriately removed and damage of the GaN film 4a with Ga-face (+c) polarity can be minimized. For this reason, as shown in FIG. 10(b), the GaN film 4a with Ga-face (+c) polarity and the GaN films 4b with N-face (−c) polarity can each be grown for each desired region. On the other hand, in a case where the surface treatment in the substrate surface treatment step is insufficient and the carbon layer 3 is remaining on the sapphire substrate 1, the lateral growth of the GaN film 4a with Ga-face (+c) polarity is observed as shown in FIG. 10(a) rather than the growth of the GaN films 4b with N-face (−c) polarity. Alternatively, in a case where the surface treatment in the substrate surface treatment step is excessive, the surface of the GaN film 4a with Ga-face (+c) polarity is damaged as shown in FIG. 10(c).

Although GaN is used as a material for the semiconductor thin film 4 in Embodiment 1, this does not imply any limitation. For example, AlGaN or the like can be used as a material for the semiconductor thin film 4. Further, although in Embodiment 1 metal organic chemical vapor deposition is used as a method for growing the semiconductor thin film 4, this does not imply any limitation. For example, concomitant use of the halide vapor-phase epitaxy method (HVPE method) in the thin film growth step (II) allows the growth of a thick film by increasing the growth rate.

Figure 11:
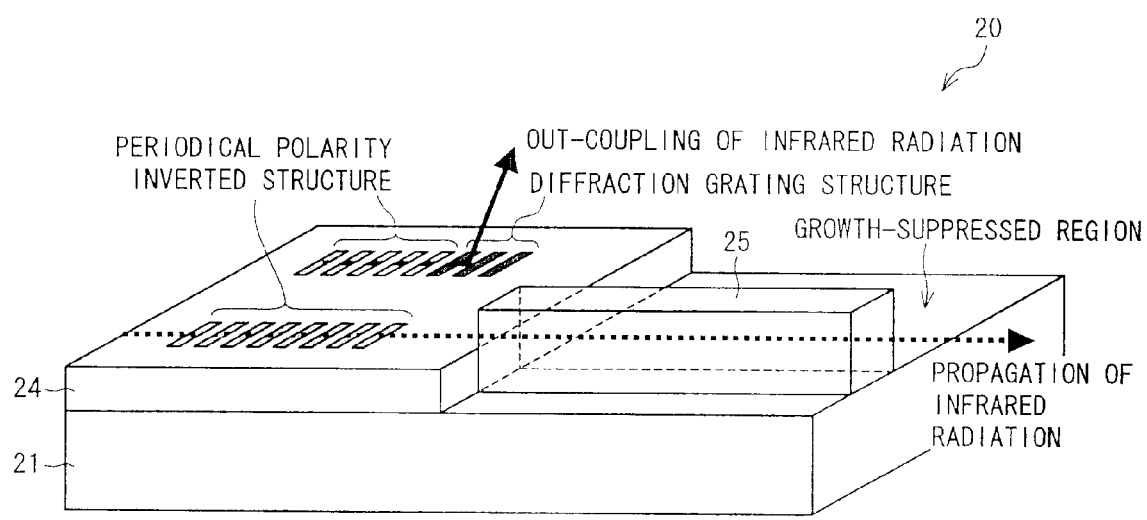
FIG. 11

FIG. 11 is a perspective view of an optical integrated circuit including a semiconductor thin film 4 fabricated by the method for fabricating a semiconductor thin film according to Embodiment 1. As shown in FIG. 11, the optical integrated circuit 20 includes: a GaN layer 24, which has a periodical polarity inverted structure and a diffraction grating structure, formed on the sapphire substrate 21 by the method for fabricating a semiconductor thin film according to Embodiment 1; a ridge optical waveguide 25 based on GaN formed on the sapphire substrate 21 by the method for fabricating a semiconductor thin film according to Embodiment 1; and a growth-suppressed region formed on the sapphire substrate 21 by the method for fabricating a semiconductor thin film according to Embodiment 1.

Excitation light incident on one end face of the GaN layer 24 is wavelength-converted by propagating through the region with periodical polarity inverted structure formed in the GaN layer 24.

It should be noted here that in a case where conventional lithium niobate is used as a nonlinear optical medium for wavelength conversion, the wavelength range obtained with difference frequency generation is limited to wavelengths shorter than approximately 5 µm. On the other hand, in a case where a GaN layer having a periodical polarity inverted structure according to Embodiment 1 is used as a nonlinear optical medium for wavelength conversion, it is expected that the wavelength range obtained by difference frequency generation can be extended into longer wavelength region up to approximately 13 µm. The application of a GaN layer having a periodical polarity inverted structure according to Embodiment 1 to a nonlinear optical medium for wavelength conversion would allow generation of infrared radiation in longer wavelength region that is inaccessible by a conventional nonlinear optical medium for use in wavelength conversion.

The infrared radiation generated by wavelength conversion at the periodical polarity inverted structure inside the GaN layer 24 can be efficiently out-coupled from the GaN layer 24 by the diffraction grating structure formed in the GaN layer 24 or by prism coupling. Alternatively, the infrared radiation can be made incident on the ridge optical waveguide 25 disposed in contact with the other end face of the GaN layer 24.

The ridge optical waveguide 25, which is composed of GaN, can be formed by selectively growing a GaN film 4 on the sapphire substrate 21 by a selective growth method including the substrate surface pretreatment step, organic layer coating step, focused light irradiation step, cleaning step, and thin film growth step (I) of the method for fabricating a semiconductor thin film according to Embodiment 1. Radiation incident on an inner part of the ridge optical waveguide 25 propagates by total reflection inside of the ridge optical waveguide 25.

Thus, the optical integrated circuit 20 makes it possible to generate infrared radiation that has been inaccessible by conventional means and to propagate the infrared radiation in a desired direction using the ridge optical waveguide 25.

It should be noted that the GaN film 4 having a periodical polarity inverted structure according to Embodiment 1 can also be suitably applied to an optical parametric oscillator.

Further, the aforementioned selective growth method also makes it possible to fabricate a channel structure on the order of micrometers and to fabricate a sample cell in which a minute amount of a sample is transported by a laminar flow. By coupling the aforementioned optical waveguide to this sample cell, an optical integrated circuit structure can be configured including an infrared light source. If infrared spectroscopic measurement is achieved on a cell level, it can be expected that the optical integrated circuit would be applied to a biosensor useful for identifying biomolecular species.

According to Embodiment 1, as described above, a sapphire substrate 1 treated in hydrogen at high temperatures is coated with an organic layer 2 and irradiated with focused light pulses 12 obtained from a regenerative amplifier or the like, and a carbon layer 3 with a thickness of several nanometers is formed on a surface of the sapphire substrate 1. Then, when a GaN film 4a has been grown on the sapphire substrate 1, the carbon layer 3 has a growth-mask effect equivalent to that of a growth-mask on the GaN film 4a. This allows selective growth of the GaN film 4a for each desired region on the sapphire substrate 1.

Furthermore, the inventors of the present invention found that the growth-mask effect arising from the carbon layer 3 can be eliminated by the substrate surface treatment step after the thin film growth step (I). By thus switching between the presence and absence of the growth-mask effect arising from the carbon layer 3, it is possible to introduce a difference in time of the beginning of thin film growth between a desired region on the sapphire substrate 1 and the other.

Further, by, after removing the carbon layer 3, forming a modified surface 5 by modifying an exposed surface of the sapphire substrate 1 in the substrate surface modification step, a mosaic of GaN films 4b that are distinct in growth mode from the GaN film 4a can be formed over a surface of the modified surface 5 in the subsequent thin film growth step (II). This allows fabrication of a semiconductor thin film 4 having its growth mode controlled for each desired region.

Thus, the method and apparatus for fabricating a semiconductor thin film according to Embodiment 1 are techniques with a new concept to locally control the growth mode of a nitride semiconductor, and can be applied to fabrication of an element structure within a thin film. Since neither an ultra-high-vacuum environment nor an etching step is required, in contrast to a conventional case, the number of steps and the costs would be reduced. For example, it becomes possible to fabricate a nonlinear optical element having periodical polarity inverted structure using a semiconductor thin film. This makes it possible to broaden the applications of semiconductor thin films in optical materials. Further, semiconductor thin films have already been in practical use as various optical elements, thus their functions would be integrated into a single substrate.

Although Embodiment 1 has shown an example where a GaN film 4 is grown with periodically inverted polarity, this does not imply any limitation. It is possible to use other nitrides such as AlGaN mentioned above.

Although Embodiment 1 has described, as an example of a semiconductor thin film having a distinct (transformed) growth mode for each desired region, a semiconductor thin film with periodically inverted polarity, this does not imply any limitation. The growth mode includes properties such as growth orientation and crystal structure as well as polarity.

[Embodiment 2]

A second embodiment of the present invention is described below with reference to (a) through (h) of FIG. 12. The components other than those described in Embodiment 2 are the same as those described in Embodiment 1. Further, for convenience of explanation, those members which have the same functions as those shown in the drawings of Embodiment 1 are given the same reference numerals and, as such, is not described.

Figure 12:
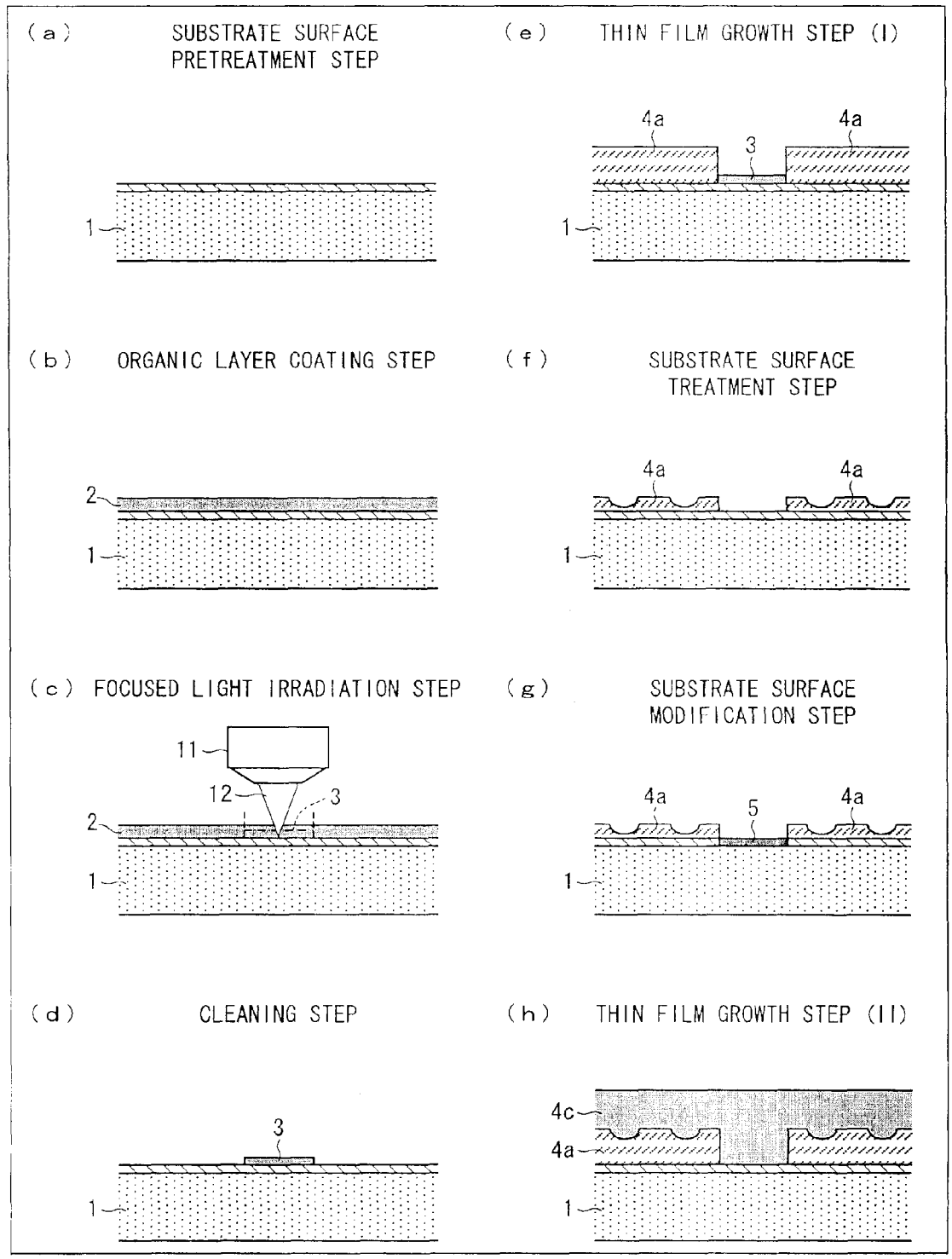
FIG. 12

FIG. 12 shows cross-sectional views (a) through (h) to explain a method for fabricating a semiconductor thin film 4 according to Embodiment 2. As shown in (a) through (h) of FIG. 12, the method for fabricating a semiconductor thin film according to Embodiment 2 includes (a) a substrate surface pretreatment step, (b) an organic layer coating step, (c) a focused light irradiation step, (d) a cleaning step, (e) a thin film growth step (I), (f) a substrate surface treatment step, (g) a substrate surface modification step, and (h) a thin film growth step (II).

It should be noted here that the method for fabricating a semiconductor thin film according to Embodiment 2 differs from the method for fabricating a semiconductor thin film according to Embodiment 1 in that a material distinct from GaN is used during the thin film growth step (II).

It should be noted that the steps from the substrate surface pretreatment step of (a) of FIG. 12 to the substrate surface treatment step of (f) of FIG. 12 are identical in content to those of Embodiment 1 and, as such, are not described here.

In the method for fabricating a semiconductor thin film according to Embodiment 2, the substrate surface modification step of (g) of FIG. 12 is executed after the substrate surface treatment step of (f) of FIG. 12. A substrate surface modification step necessary for the growth of a thin film of a material distinct from GaN is appropriately executed depending on the type of material. This allows growth of a thin film 4c distinct from GaN on the sapphire substrate 1 and on the Ga-face polar GaN film 4a during the thin film growth step (II) of (g) FIG. 12. For example, AlGaN, InGaN, or the like can be used as a material for the thin film 4c distinct from GaN.

Thus, the method for fabricating a semiconductor thin film according to Embodiment 2 makes it possible to fabricate a heterogeneous thin film structure in a semiconductor thin film.

[Embodiment 3]

A third embodiment of the present invention is described below with reference to FIGS. 13 through 24. In Embodiment 3, another embodiment of the apparatus 6 for fabricating a semiconductor thin film of FIG. 2 is described. The components other than those described in Embodiment 3 are the same as those described in Embodiments 1 and 2.

Figure 13:
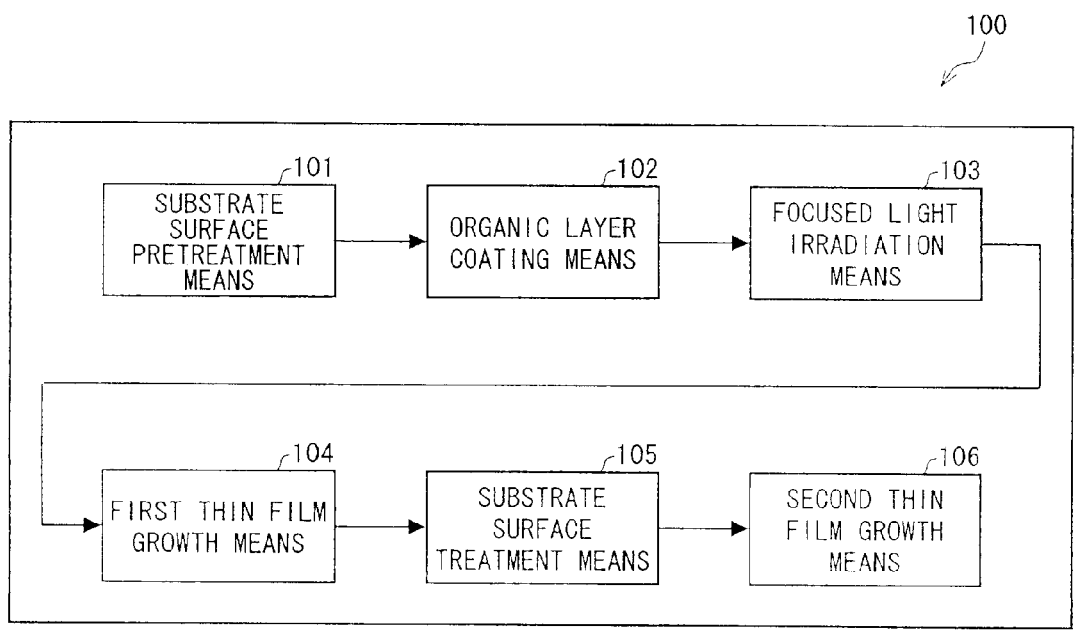
FIG. 13

FIG. 13 is a block diagram showing a configuration of an apparatus 100 for fabricating a semiconductor thin film according to Embodiment 3. As shown in FIG. 13, the apparatus 100 for fabricating a semiconductor thin film includes substrate surface pretreatment means 101, organic layer coating means 102, focused light irradiation means 103, first thin film growth means 104, substrate surface treatment means 105, and second thin film growth means 106.

The substrate surface pretreatment means 101 is means for executing the substrate surface pretreatment step of (a) of FIG. 1, and treats a sapphire substrate 1 in hydrogen at high temperatures. Specifically, the substrate surface pretreatment means 101 treats the sapphire substrate 1 in hydrogen for 10 minutes at high temperatures (around 1,060° C.) at near-atmospheric pressure, thereby enabling the epitaxial growth of a GaN film 4 on a surface of the sapphire substrate 1.

The organic layer coating means 102 is means for executing the organic layer coating step of (b) of FIG. 1, and the surface of the sapphire substrate 1 is coated with an organic layer 2 in atmosphere.

The focused light irradiation means 103 is means for executing the focused light irradiation step of (c) of FIG. 1, and the surface of the sapphire substrate 1 coated with the organic layer 2 is irradiated with focused laser pulses 12a (e.g., femtosecond laser pulses obtained from a titanium sapphire regenerative amplifier excited by a titanium-sapphire laser; with a center wavelength of 800 nm, a pulse width of approximately 100 fs, and a repetition rate of 1 kHz). The focused light irradiation means 103 forms a carbon layer 3 on the sapphire substrate 1, for example, by irradiating, with the focused femtosecond laser pulses obtained from the titanium sapphire regenerative amplifier, the sapphire substrate 1 coated with the organic layer 2. It should be noted that the light with which the focused light irradiation means 103 irradiates the sapphire substrate 1 is not limited to the laser pulses 12a, but may be continuous-wave laser light, for example.

It should be noted here that in irradiating, with the focused laser pulses 12a, the surface of the sapphire substrate 1 coated with the organic layer 2, the focused light irradiation means 103 determines an optimum height of the focal point of a focusing lens 34 with respect to the surface of the sapphire substrate 1, depending on the conditions of irradiation with the laser pulses 12a, so that there does not occur ablation arising from an excessive irradiation or so that the growth-mask effect should not be lost due to incomplete irradiation. It should be noted that the focused light irradiation means 103 will be described in detail later.

The first thin film growth means 104 is means for executing the thin film growth step (I) of (e) of FIG. 1, and a GaN film 4a with Ga-face (+c) polarity is grown on the sapphire substrate 1 from which the organic layer 2 has been removed in the cleaning step of (d) of FIG. 1. For example, a metal organic chemical vapor deposition apparatus (MOCVD apparatus) or the like can be used as the first thin film growth means 104.

The substrate surface treatment means 105 is means for executing the substrate surface treatment step of (f) of FIG. 1 and the substrate surface modification step of (g) of FIG. 1, thus achieving removal of the carbon layer 3 formed on the sapphire substrate 1 and modification of the exposed surface of the sapphire substrate 1. The substrate surface treatment means 105 allows removal of the carbon layer 3, for example, by treating the sapphire substrate 1 in hydrogen at high temperatures (at approximately 1,040° C.) for 1 minute 45 seconds at near-atmospheric pressure. Further, the substrate surface treatment means 105 allows formation of a modified surface 5 by nitriding the exposed surface of the sapphire substrate 1, for example, by treating the surface of the sapphire substrate 1 for 5 minutes at approximately 1,040° C. in mixed hydrogen and ammonia (at near-atmospheric pressure in total). It should be noted that the substrate surface treatment means 105 will be described in detail later.

The second thin film growth means 106 is means for executing the thin film growth step (II) of (h) of FIG. 1, and the GaN film 4a with Ga-face (+c) polarity is continuously grown on the GaN film 4a and a GaN film 4b with N-face (−c) polarity is grown over the modified surface 5. For example, a metal organic chemical vapor deposition apparatus (MOCVD apparatus) or the like can be used as the second thin film growth means 106, as in the case of the first thin film growth means 104.

The apparatus 100 for fabricating a semiconductor thin film thus configured can suitably execute the method for fabricating a semiconductor thin film of FIG. 1 and thus allows fabrication of a semiconductor thin film while controlling a growth mode for each desired region, without requiring an etching step or an ultrahigh-vacuum environment.

The focused light irradiation means 103 of FIG. 13 is described in detail below. First, a configuration of the focused light irradiation means 103 is described.

Figure 14:
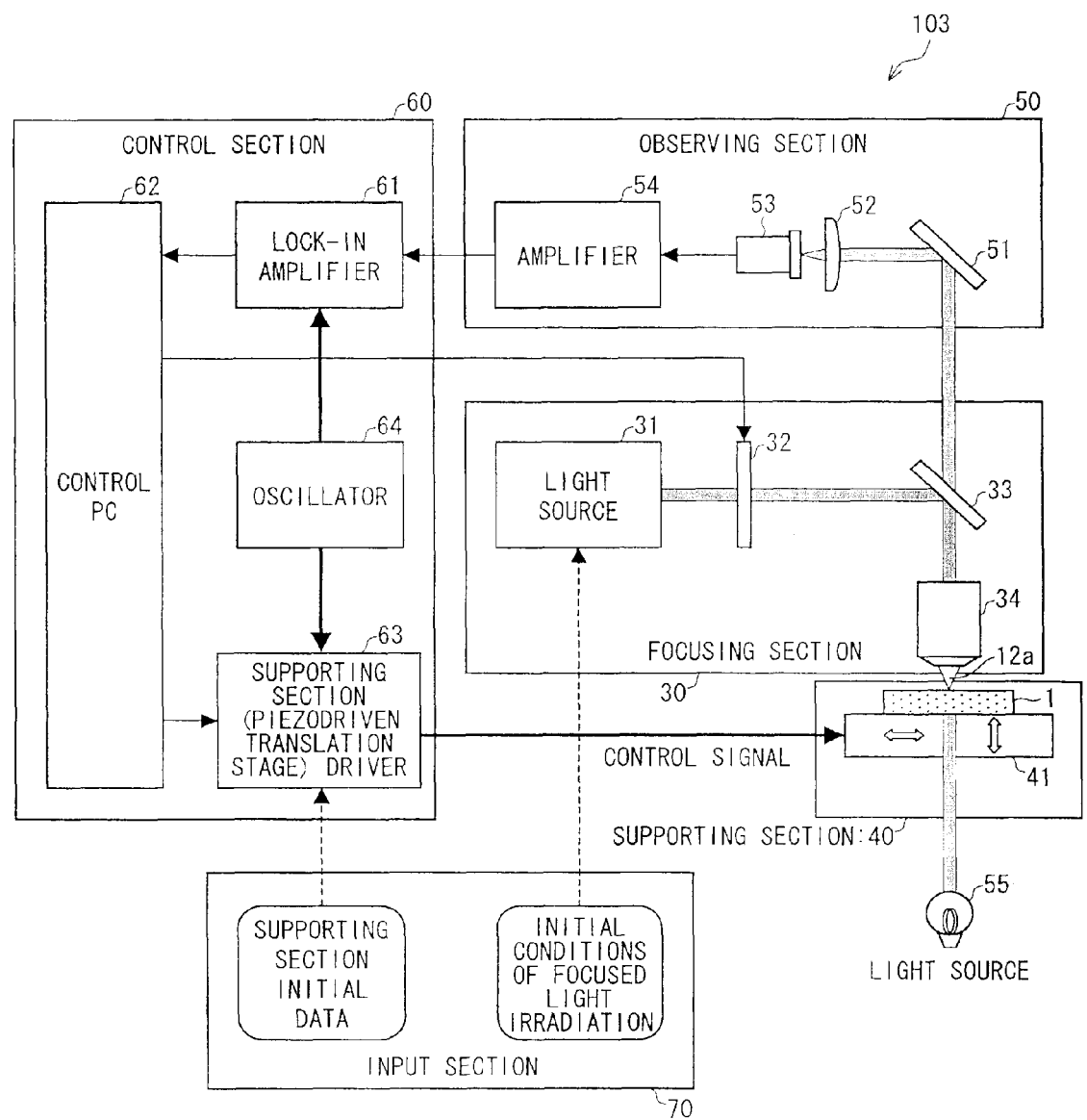
FIG. 14

FIG. 14 is a block diagram showing a configuration of the focused light irradiation means 103 of FIG. 13. As shown in FIG. 14, the focused light irradiation means 103 includes a focusing section 30, a supporting section 40, a (thin film) observing section 50, a light source (illuminating light source) 55, a control section 60, and an input section 70.

The focusing section 30 allows irradiation of the sapphire substrate 1 coated with the organic layer 2 with the laser pulses 12a. The focusing section 30 includes a light source 31, a shutter 32, a dichroic mirror 33, and the focusing lens 34.

The light source 31 emits light with which the surface of the sapphire substrate 1 is to be irradiated as focused spots. Usable examples of the light source 31 include a titanium sapphire regenerative amplifier, etc.

The shutter 32 serves to control and adjust the timing of irradiation with the laser pulses 12a.

The dichroic mirror 33, which is an optical element that reflects light, deflects the light emitted from the light source 31 toward the focusing lens 34.

The focusing lens 34 serves to focus the laser pulses 12a, and usable examples of the focusing lens 34 include an objective lens for use in an optical microscope, etc.

In the focusing section 30 thus configured, the laser pulses 12a emitted from the light source 31 reaches the focusing lens 34 through the shutter 32 and the dichroic mirror 33, focused by the focusing lens 34, and is passed through the sapphire substrate 1 placed on a stage 41 of the supporting section 40.

The supporting section 40 includes the stage 41 on which the sapphire substrate 1 is placed. The stage 41 can be translated horizontally or vertically and, by moving the sapphire substrate 1 vertically, adjusts the height of the focal point of the focusing lens 34 with respect to the surface of the sapphire substrate 1. Further, the stage 41 is provided with a through-hole through which the after-mentioned illuminating light is allowed to pass. Usable examples of the stage 41 include a piezodriven translation stage, etc.

The light source 55, disposed in such a position as to face a back surface of the sapphire substrate 1 placed on the stage 41, emits illuminating light in a direction from the back surface to the surface of the sapphire substrate 1.

The observing section 50 observes an optical image of the surface of the sapphire substrate 1, thereby grasping an optical system at the time of focused light irradiation of the surface of the sapphire substrate 1 with the laser pulses 12a and observing an effect of focused light irradiation. The observing section 50 includes a mirror 51, a lens 52, an image pickup element 53, and an amplifier 54.

The mirror 51 serves to deflect light emitted from the focusing lens 34, causing the light sent through the lens 52.

The lens 52 serves to form an image in the image pickup element 53 for the light reflected by the mirror 51.

The image pickup element 53 serves to convert the optical image formed by the lens 52 into an electrical signal. That is, the image pickup element 53 is a sensor device that photoelectrically converts the light propagating from the lens 52. The image pickup element 53 has a light-receiving surface on which a plurality of pixels are disposed in a matrix manner. The image pickup element 53 converts the optical image formed on the light-receiving surface into a signal, and outputs the signal to the amplifier 54. Usable examples of the image pickup element 53 include a CCD (charge-coupled device) image sensor, a CMOS (complementary metal-oxide semiconductor) image sensor, a VMIS image sensor (threshold voltage modulation image sensor), etc.

The amplifier 54 amplifies or converts the signal sent from the image pickup element 53 and sends it to the control section 60.

The observing section 50 thus configured causes light emitted by the light source 55 toward an object on the surface of the sapphire substrate 1 to travel through the focusing lens 34 and the dichroic mirror 33 in sequence. Then, the light deflected by the mirror 51 is focused by the lens 52 to form an image into the image pickup element 53. The image pickup element 53 converts the image into an electrical signal. The signal is sent to the control section 60 after being amplified or converted by the amplifier 54.

The control section 60 controls the operation of each of the components of the focused light irradiation means 103. The control section 60 includes a lock-in amplifier 61, a control PC 62, a supporting section (piezodriven translation stage) driver 63, and an oscillator 64.

The oscillator 64, on the one hand, wobbles the stage 41 vertically by sending a reference signal to the supporting section driver 63 and, on the other hand, sends a reference signal of the same frequency to the lock-in amplifier 61, with the result that the electrical signal that is sent from the amplifier 54 to the lock-in amplifier 61 becomes a synchronized alternating-current signal.

From among electrical signals sent from the amplifier 54, the lock-in amplifier 61 detects only an alternating-current signal synchronized with the reference signal from the oscillator 64. Then, the lock-in amplifier 61 amplifies the alternating-current signal and then sends it to the control PC 62. This allows the control PC 62 to detect an alternating-current signal with a satisfactory S/N ratio.

The control PC 62 analyzes the alternating-current signal sent from the lock-in amplifier 61 and controls the supporting section driver 63 in accordance with a result of the analysis. Further, the control PC 62 controls the opening and closing of the shutter 32 to define the beginning and end of focused light irradiation.

The supporting section driver 63 drives the stage 41 of the supporting section 40 vertically in accordance with a control signal from the control PC 62 to adjust the distance between the surface of the sapphire substrate 1 and the focal point of the focusing lens.

Usable examples of the supporting section driver 63 include a driver for use in a piezodriven translation stage, etc.

The input section 70 is an interface through which to enter various conditions of operation into the focused light irradiation means 103, e.g., through which to enter supporting section initial data on the supporting section 40, initial conditions of focused light irradiation by the focused light irradiation section 30, etc.

Next, the operation of the focused light irradiation means 103 is described. As described above, in irradiating, with the focused laser pulses 12a, the surface of the sapphire substrate 1 coated with the organic layer 2, the focused light irradiation means 103 determines the optimum height of the focal point of the focusing lens 34 with respect to the surface of the sapphire substrate 1, depending on the conditions of irradiation with the laser pulses 12a, so that there does not occur ablation arising from an excessive irradiation or so that the growth-mask effect should not be lost due to incomplete irradiation.

For this purpose, the focused light irradiation means 103 automatically positions the sapphire substrate 1 so that the laser pulses 12a can be focused at an appropriate height with respect to the surface of the sapphire substrate 1. In the following, for convenience of explanation, the organic layer 2 is omitted.

Figure 15:
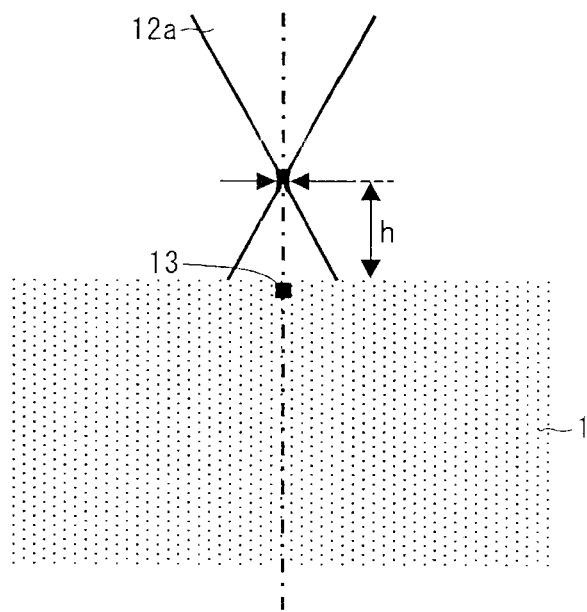
FIG. 15(a)
FIG. 15(b)
Figure 15:
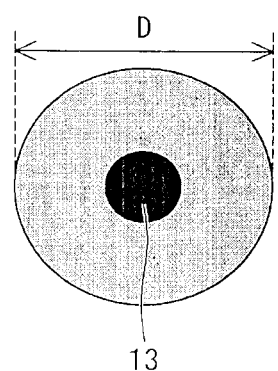

FIG. 15(a) is a cross-sectional view obtained when the focusing lens 34 has its focal point above the surface of the sapphire substrate 1. FIG. 16(a) is a cross-sectional view obtained when the focusing lens 34 has its focal point on the surface of the sapphire substrate 1. FIG. 17(a) is a cross-sectional view obtained when the focusing lens 34 has its focal point below the surface of the sapphire substrate 1. It should be noted that in FIGS. 15(a) through 17(a), the solid lines indicate a beam of light obtained when irradiated with the laser pulses 12a. As shown in FIGS. 15(a) through 17(a), a reference dot (reference point) 13 is formed in advance on a surface area of the sapphire substrate 1 that is normal to the optical axis of the laser pulses 12a. It is desirable that the reference dot (reference point) 13 have a size close to the diffraction limit. For example, such reference dot (reference point) 13 can be formed by causing ablation on the surface of the sapphire substrate 1 using the laser pulses 12a.

FIG. 16(b) shows an optical image taken of the reference dot 13 by the image pickup element 53 in the case of FIG. 16(a). As shown in FIG. 16(a), with the focusing lens 34 having its focal point on the surface of the sapphire substrate 1, the position of the lens 52 of the observing section is adjusted in advance so that the size D of the optical image of the reference dot 13 provided on the surface of the sapphire substrate 1 is minimized. This gives such an optical image of the reference dot 13 as that shown in FIG. 16(b).

FIG. 15(b) shows an optical image taken of the reference dot 13 by the image pickup element 53 in the case of FIG. 15(a) after the position of the lens 52 of the observing section has been adjusted to the aforementioned position. In a case where the focusing lens 34 has its focal point at a height h above the surface of the sapphire substrate 1, the size D of the optical image of the reference dot 13 appears larger with a blur as shown in FIG. 15(b).

Similarly, FIG. 17(b) shows an optical image taken of the reference dot 13 by the image pickup element 53 in the case of FIG. 17(a). In a case where the focusing lens 34 has its focal point at a height h below the surface of the sapphire substrate 1, the size D of the optical image of the reference dot 13 appears larger with a blur as shown in FIG. 17(b).

Figure 18:
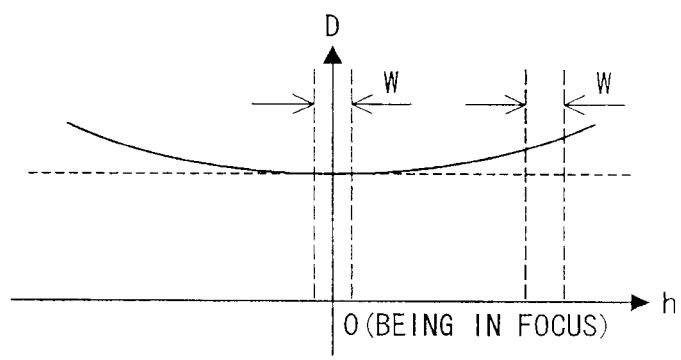
FIG. 18

FIG. 18 is a graph showing a relationship between the height h of the focal point of the focusing lens 34 and the size D of an optical image of the reference dot 13. As shown in FIG. 18, when the height h of the focusing point is zero, i.e., when the focusing lens 34 has its focal point on the surface of the sapphire substrate 1, the size D takes on a minimum value. On the other hand, the size D increases as the focal point of the focusing lens 34 gets further away upward or downward from the surface of the sapphire substrate 1.

FIG. 19(a) shows a situation where the sapphire substrate 1 of FIG. 15(a) is wobbled in the directions of an arrow. FIG. 19(b) shows a situation where the sapphire substrate 1 of FIG. 16(a) is wobbled in the directions of an arrow. FIG. 19(c) is an enlarged cross-sectional view of the light-receiving surface of the image pickup element 53 of FIG. 19(b). It should be noted that the dichoric mirror 33 and the mirror 51 are omitted below for convenience of explanation.

The control PC 62 controls the supporting section driver 63 so that the stage 41 on which the sapphire substrate 1 has been placed is wobbled vertically with amplitude W at a frequency defined by the reference signal from the oscillator 64. It should be noted here that even in a case where the sapphire substrate 1 is wobbled with constant amplitude W, there is a difference in rate of change in size D of the optical image of the reference dot 13 between a case where the focusing lens 34 has its focal point off the surface of the sapphire substrate 1 and a case where the focusing lens 34 has its focal point on the surface of the sapphire substrate 1.

That is, as shown in FIG. 18, whereas the rate of change in size D gets closer to zero in a case where the focusing lens 34 has its focal point on the surface of the sapphire substrate 1, whereas the rate of change in size D gets relatively higher as the focal point of the focusing lens 34 gets further away from the surface of the sapphire substrate 1. The wobbling is in synchronization with the frequency of the reference signal from the oscillator 64, and the oscillation of the size D is detected as an alternating-current signal synchronized with the reference signal by the image pickup element 53. An example of a method for measuring the diameter of an optical image D is, but is not limited to, extraction of the number of dark pixels corresponding to the optical image from a bright background.

Figure 20:
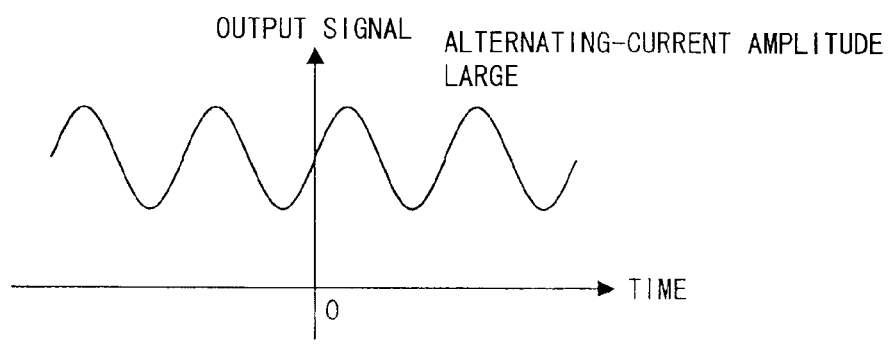
FIG. 20(a)
FIG. 20(b)
Figure 20:
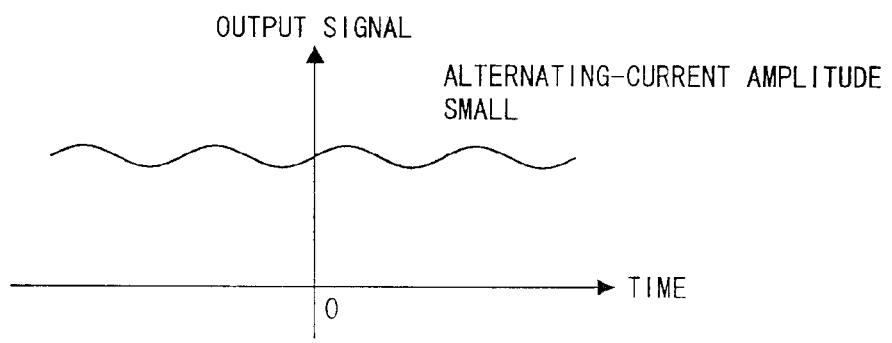

FIG. 20(*a*) is a graph showing an output signal that is converted by the image pickup element 53 during vertical wobbling when the focusing lens 34 has its focal point off the substrate surface as shown in FIG. 19(*a*). FIG. 20(*b*) is a graph showing an output signal that is converted by the image pickup element 53 during vertical wobbling when the focusing lens 34 has its focal point near the substrate surface as shown in FIG. 19(*b*). The alternating-current amplitude of the output signal at this time gets closer to zero. This is because the size D of the optical image of the reference dot 13 on the surface of the image pickup element 53 is more affected by diffraction as the focal point of the focusing lens 34 gets closer to the surface of the sapphire substrate 1. For this reason, the size D of the optical image of the reference dot 13 remains at a steady value, and the rate of change in D becomes zero, so that the alternating-current amplitude of the output signal gets closer to zero.

Therefore, when the alternating-current amplitude of a signal that is converted by the image pickup element 53 is substantially zero or takes on a minimum value, the focal point of the focusing lens 34 and the surface of the sapphire substrate 1 coincide with each other.

Accordingly, in the focused light irradiation means 103 according to Embodiment 3, the control PC 62 moves the stage 41 vertically so that the amplitude of an alternating-current signal that is obtained by the image pickup element 53 is substantially zero or takes on a minimum value. Specifically, on receipt of an alternating-current signal whose amplitude is relatively high as shown in FIG. 20(*a*), the control PC 62 moves the stage 41 vertically by controlling the supporting section driver 63. Then, when the amplitude of the alternating-current signal has come to be substantially zero or take on a minimum value, the control PC 62 stops the stage 41 by controlling the supporting section driver 63.

Thus, the focused light irradiation means 103 makes it possible to determine a reference position where the focal point of the focusing lens 34 and the surface of the sapphire substrate 1 coincide with each other. On the basis of the reference, the height of the focal point of the focusing lens 34 with respect to the sapphire substrate 1 can be adjusted.

Figure 21A:
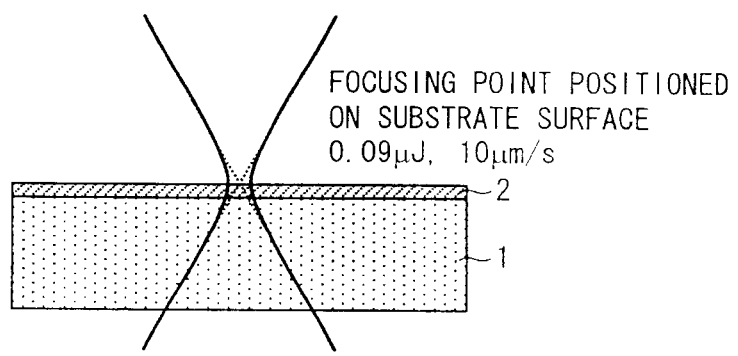
FIG. 21(a)
Figure 21B:
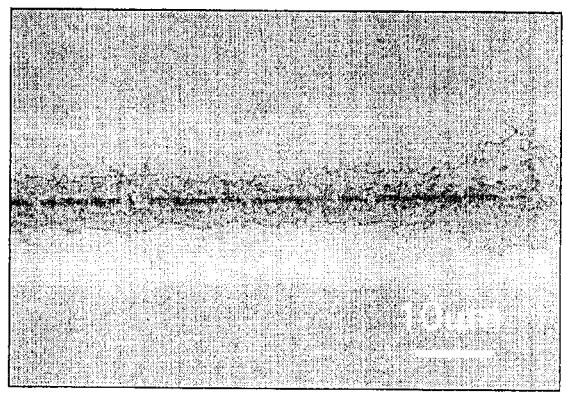
FIG. 21(b)

FIG. 21(*a*) is a cross-sectional view showing focused light irradiation with the laser pulses 12*a* in a case where the focusing lens 34 has its focal point on the surface of the sapphire substrate 1. FIG. 21(*b*) is a photograph of a GaN film 4*a* selectively grown on the sapphire substrate 1 irradiated with the focused laser pulses 12*a* under the condition of FIG. 21(*a*).

In the case of focused light irradiation with the laser pulses 12*a* of 0.09 µJ/pulse at a translation speed of 10 µm/s when the focusing lens 34 has its focal point on the surface of the sapphire substrate 1 as shown in FIG. 21(*a*), there occurs ablation around the focused-light-irradiated region as shown in FIG. 21(*b*). This shows that the focused light irradiation with the laser pulses 12*a* is excessive because the distance between the surface of the sapphire substrate 1 and the focal point of the focusing lens 34 is too small.

FIG. 22(*a*) is a cross-sectional view showing focused light irradiation with the laser pulses 12*a* in a case where the focusing lens 34 has its focal point at a height of approximately 15 µm above the surface of the sapphire substrate 1. FIG. 22(*b*) is a photograph of a GaN film 4*a* selectively grown on the surface of the sapphire substrate 1 irradiated with the focused laser pulses 12*a* under the condition of FIG. 22(*a*).

In the case of focused light irradiation with the laser pulses 12*a* of 0.09 µJ/pulse at a translation speed of 10 µm/s when the focusing lens 34 has its focal point at a height of approximately 15 µm above the surface of the sapphire substrate 1 as shown in FIG. 22(*a*), there occurs no ablation around the focused-light-irradiated region as shown in FIG. 22(*b*). This shows that the distance between the surface of the sapphire substrate 1 and the focal point of the focusing lens 34 is adequate and the conditions of focused light irradiation with the laser pulses 12*a* is suitable.

FIG. 23(*a*) is a cross-sectional view showing focused light irradiation with the laser pulses 12*a* in a case where the focusing lens 34 has its focal point at a height of approximately 24 µm above the surface of the sapphire substrate 1. FIG. 23(*b*) is a photograph of a GaN film 4*a* selectively grown on the surface of the sapphire substrate 1 irradiated with the focused laser pulses 12*a* under the condition of FIG. 23(*a*).

In the case of focused light irradiation with the laser pulses 12*a* of 0.09 µJ/pulse at a translation speed of 10 µm/s when the focusing lens 34 has its focal point at a height of approximately 24 µm above the surface of the sapphire substrate 1 as shown in FIG. 23(*a*), the selective growth becomes incomplete as shown in FIG. 23(*b*). This shows that the focused light irradiation with the laser pulses 12*a* is insufficient because the distance between the surface of the sapphire substrate 1 and the focal point of the focusing lens 34 is too large.

All these shows that in the case of focused light irradiation with the laser pulses 12*a* of 0.09 µJ/pulse at a translation speed of 10 µm/s, the optimum height of the focal point of the focusing lens 34 with respect to the surface of the sapphire substrate 1 is approximately 15 µm. By thus determining the optimum height of the focal point of the focusing lens 34 with reference to the surface of the sapphire substrate 1, the growth-mask layer (carbon layer 3) can be stably formed in the focused light irradiation step.

The substrate surface treatment means 105 is described below.

Figure 24:
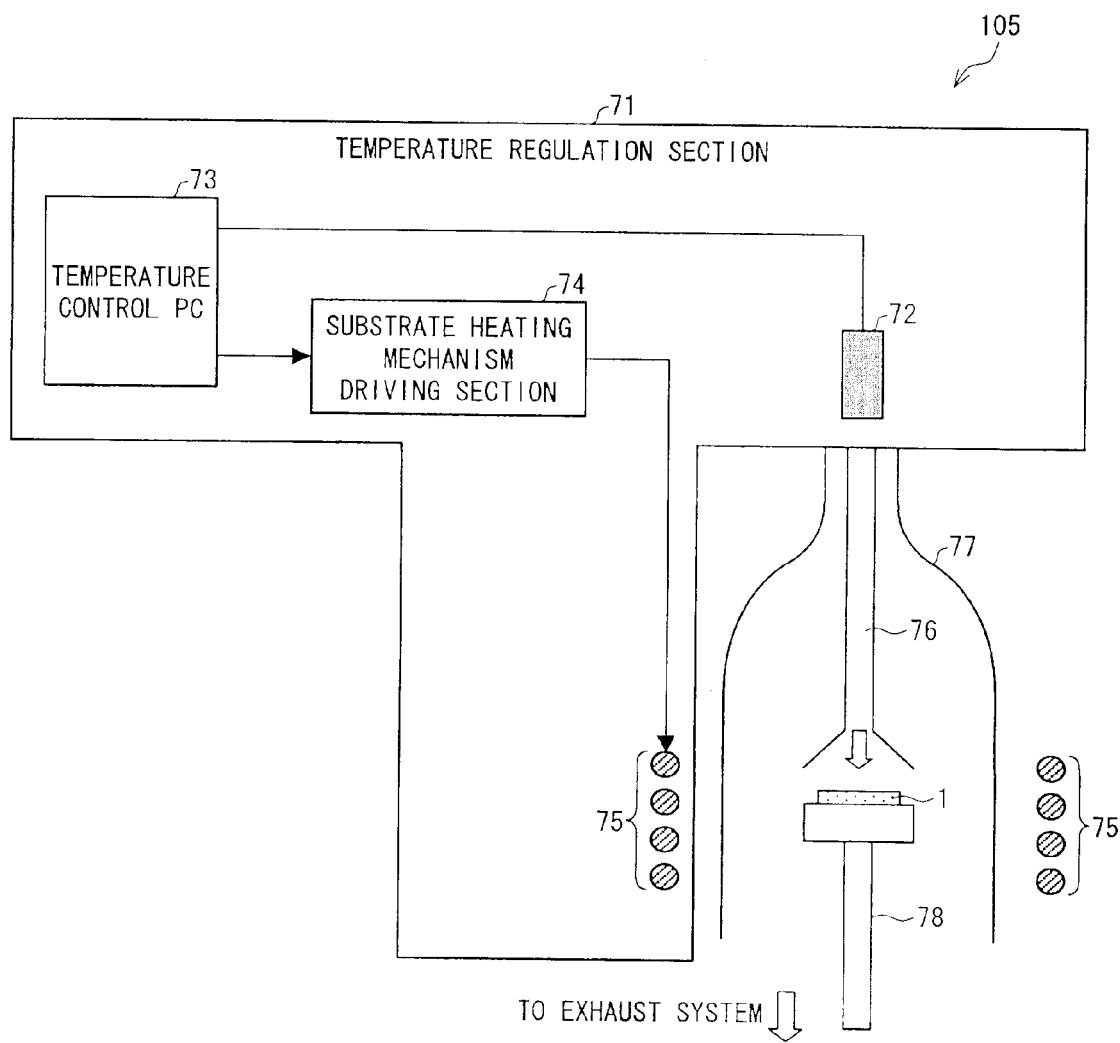
FIG. 24

FIG. 24 is a cross-sectional view showing a configuration of the substrate surface treatment means 105 of FIG. 13. As shown in FIG. 24, the substrate surface treatment means 105 includes a holding section 78, a temperature regulation section 71, a gas inlet section 76, and a treatment chamber 77.

The holding section 78, on which the sapphire substrate 1 is placed, is disposed in the treatment chamber 77.

The temperature regulation section 71, which serves to control the surface temperature of the sapphire substrate 1, includes a (radiation) thermometer 72, a temperature control PC 73, a substrate heating mechanism driving section 74, and a substrate heating mechanism 75.

The thermometer 72 serves to measure the temperature of the sapphire substrate 1.

The temperature control PC 73 serves to control the operation of the temperature regulation section 71 as a whole. In order to optimize the surface temperature of the sapphire substrate 1, the temperature control PC 73 acquires a temperature reading from the thermometer 72, generates a control signal on the basis of the temperature reading, and sends the control signal to the substrate heating mechanism driving section 74.

The substrate heating mechanism driving section 74 serves to manage driving of the substrate heating mechanism 75 in accordance with the control signal sent from the temperature control PC 73. Upon receiving the control signal, which requests the substrate heating mechanism 75 to be driven, from the temperature control PC 73, the substrate heating mechanism driving section 74 sends a driving signal to the substrate heating mechanism 75 to drive the substrate heating mechanism 75.

The substrate heating mechanism 75 serves to heat the sapphire substrate 1 in accordance with the driving signal from the substrate heating mechanism driving section 74. Usable examples of the substrate heating mechanism 75 include radio-frequency heating, etc.

The gas inlet section 76 serves to introduce a gas to the sapphire substrate 1 to regulate a gaseous atmosphere.

The substrate surface treatment means 105 thus configured can be used to execute the substrate surface treatment step of (f) of FIG. 1 and the substrate surface modification step of (g) of FIG. 1. The substrate surface treatment means 105 makes it possible in the substrate surface treatment step to remove the carbon layer 3 by treating the sapphire substrate 1 in hydrogen for 1 minute 45 seconds at high temperatures (approximately 1,040° C.) at near-atmospheric pressure. Further, the substrate surface treatment means 105 makes it possible in the substrate surface modification step to form a modified surface 5 by nitriding the exposed surface of the sapphire substrate 1, for example, by treating the surface of the sapphire substrate 1 for 5 minutes at approximately 1,040° C. in mixed hydrogen and ammonia (at near-atmospheric pressure in total).

As above, Embodiment 3 makes it possible to achieve an apparatus 100 for fabricating a semiconductor thin film while controlling a growth mode for each desired region, without the need for an etching step or an ultrahigh-vacuum environment that have conventionally been required in pattern formation.

It has been proposed in Embodiment 3 that the distance between a focusing point and a sapphire substrate 1 can be detected by analyzing an optical image of a reference dot formed on a surface the substrate. In particular, an automated system has been proposed in which a rate of change in contour of an optical image is extracted as an alternating-current signal by wobbling the substrate surface vertically. However, the present invention is not limited to such a system. Various types of method of image processing, such as extraction of a rate of change in contour of an optical image by an image difference, are also encompassed in the present invention.

EXAMPLES

An example of a method for fabricating a semiconductor thin film according to an embodiment is described below with reference to FIGS. 25(a) through 25(c).

In Example 1, the method for fabricating a semiconductor thin film according to Embodiment 1 was used to form, on a sapphire substrate 1, a GaN film 4 having a periodical polarity inverted structure.

First, in the substrate surface pretreatment step, the sapphire substrate 1 was treated in hydrogen at high temperatures (approximately 1,060° C.) for 10 minutes at near-atmospheric pressure.

Next, in the organic layer coating step, the sapphire substrate 1 was coated with an organic layer 2 with a thickness of approximately 20 nm. In this example, the organic layer 2 used was poly(isothianaphthenediyl-sulfonate) (ESPACER 300Z; manufactured by Showa Denko K.K.; composed mainly of the organic polymer named just above).

Then, in the focused light irradiation step, femtosecond light pulses, generated using titanium sapphire regenerative amplifier (which had a center wavelength of 800 nm, a pulse width of approximately 100 fs, and a repetition rate of 1 kHz) were focused into the organic layer 2 by a focusing lens 11 with a numerical aperture of 0.46 (an effective numerical aperture of 0.32) (incident energy: 0.05 µJ/pulse; focusing point: positioned at a height of approximately 15 µm above the sapphire substrate; translation speed: 10 µm/s, width of each focused-light-irradiated region along a longitudinal direction: 20 µm; width of each focused-light-irradiated region along a transverse direction: 100 µm; period of the focused-light-irradiated regions: 40 µm), whereby a carbon layer 3 containing carbon species was formed on the sapphire substrate 1.

Then, in the cleaning step, the sapphire substrate thus irradiated with focused light was cleaned in purified water, whereby an unnecessary part of the organic layer 2 was removed.

Then, in the thin film growth step (I), a GaN film 4a having a film thickness of approximately 0.85 µm was grown on the sapphire substrate 1 using metal organic chemical vapor deposition (MOCVD). In this step, the growth of the GaN film 4a was suppressed (masked) over a region where the carbon layer 3 had been formed.

Then, in the substrate surface treatment step, the sapphire substrate 1 was treated in hydrogen at high temperatures (approximately 1,040° C.) for 1 minute and 45 seconds at near-atmospheric pressure, whereby the carbon layer 3 formed in the focused light irradiation step was removed.

Then, in the substrate surface modification step, the surface of the sapphire substrate 1 was treated in mixed hydrogen and ammonia (at near-atmospheric pressure with a hydrogen/ammonia ratio of 4/3) at high temperatures (approximately 1,040° C.) for 5 minutes, whereby those regions on the surface of the sapphire substrate 1 which had been exposed in the substrate surface treatment step were nitrided to form modified surfaces 5.

Finally, a GaN film 4b was grown in the thin film growth step (II), up to approximately 7 µm thick deposition.

Figure 25A:
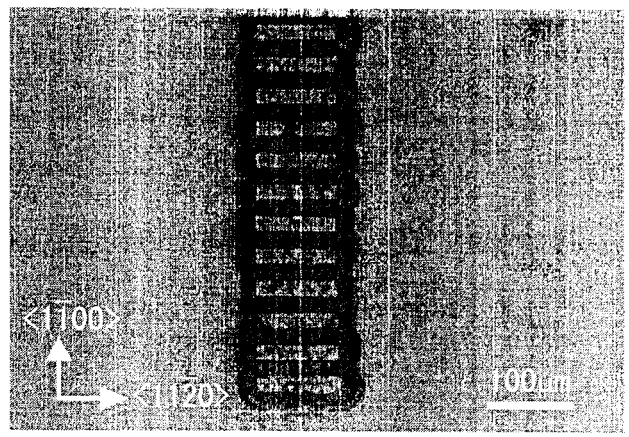
FIG. 25(a)
Figure 25B:
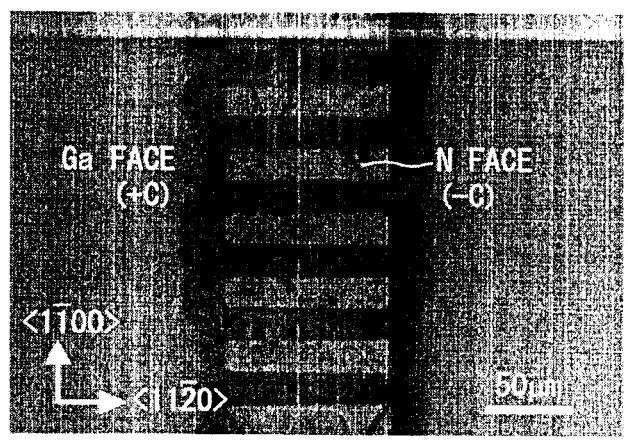
FIG. 25(b)
Figure 25C:
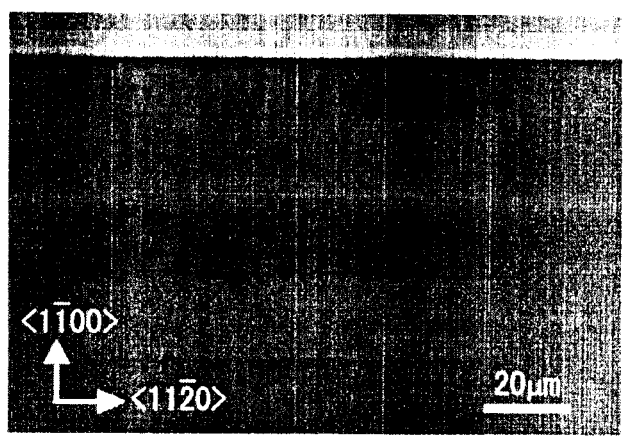
FIG. 25(c)

Through all these steps, a GaN film 4 having a periodical polarity inverted structure shown in FIGS. 25(a) through 25(c) was formed. FIG. 25(a) is a planimetric photograph of the GaN film 4 having a periodical polarity inverted structure according to the example. FIG. 25(b) is a partially-enlarged photograph of the GaN film 4 having a periodical polarity inverted structure of FIG. 25(a). FIG. 25(c) is a partially-enlarged photograph of the GaN film 4 having a periodical polarity inverted structure of FIG. 25(b).

As shown in FIG. 25(a), a row of GaN films 4b with N-face polarity placed at regular intervals was formed within a GaN film 4a with Ga-face (+c) polarity. Further, the dimensions of each N-face GaN domain shown in FIGS. 25(b) and 25(c)

correspond substantially to the dimensions of each of the focused-light-irradiated region.

It has been thus demonstrated that the method for fabricating a semiconductor thin film allows the growth of a GaN film 4 having its polarities inverted for each desired region on the sapphire substrate 1.

The present invention is not limited to the description of the embodiments above, but may be altered by a skilled person within the scope of the claims. An embodiment based on a proper combination of technical means disclosed in different embodiments is encompassed in the technical scope of the present invention.

As described above, an apparatus for fabricating a semiconductor thin film according to the present embodiment includes: substrate surface pretreatment means for pretreating a surface of a substrate; organic layer coating means for coating, with an organic layer, the substrate thus pretreated; focused light irradiation means for irradiating, with focused light, the substrate coated with the organic layer, and for forming a growth-mask layer while controlling layer thickness; first thin film growth means for selectively growing a semiconductor thin film over an area around the growth-mask layer; substrate surface treatment means for, after exposing the surface of the substrate by removing the growth-mask layer, modifying the exposed surface of the substrate; and second thin film growth means for further growing the semiconductor thin film and growing a semiconductor thin film over the modified surface of the substrate.

Further, a method for fabricating a semiconductor thin film according to the embodiment includes: coating a substrate with an organic layer; forming a growth-mask layer containing carbon species by irradiating, with focused light, the substrate coated with the organic layer; selectively growing a semiconductor thin film over an area around the growth-mask layer; exposing a surface of the substrate by removing the growth-mask layer; modifying the exposed surface of the substrate; and further growing the semiconductor thin film and growing a semiconductor thin film on the modified surface of the substrate.

According to the foregoing configuration, a desired region on the substrate coated with the organic layer by the organic layer coating means is irradiated with focused light by the focused light irradiation means. This leads to the formation of the growth-mask layer containing carbon species and having a growth-mask effect on the semiconductor thin film growth, thereby allowing selective growth of the semiconductor thin film in the first thin film growth means. Furthermore, the growth-mask layer can be removed. By the substrate surface treatment means, the growth-mask layer is removed and the exposed surface of the substrate is modified. Then the second thin film growth means allows a semiconductor thin film growth under a transformed growth mode over the modified surface of the substrate by growing further a semiconductor thin film.

The term "substrate surface modification" here means changing the properties of a surface of a substrate in order to transform the growth mode of a semiconductor thin film that grows on the surface of the substrate. That is, a semiconductor thin film is grown over the modified surface of the substrate under a transformed growth mode. The modification may be achieved by either (i) changing the properties by chemically transforming the substrate per se or (ii) changing the properties of the surface of the substrate by forming a thin film on the surface of the substrate. It should also be noted that the term "growth mode" refers, for example, to the presence or absence of growth-mask, growth orientation (such as polarity), crystal structure, etc.

Thus, the embodiment makes it possible to form a semiconductor thin film while controlling a growth mode for each desired region, without requiring an etching step or an ultra-high-vacuum environment, in contrast to a conventional case.

The apparatus for fabricating a semiconductor thin film according to the embodiment is preferably configured such that the focused light irradiation means includes: a supporting section on which the substrate is placed, the supporting section being capable of being translated horizontally or vertically; a focusing section for irradiating, with focused light, the surface of the substrate placed on the supporting section; an observing section for observing an optical image of the surface of the substrate to grasp a distance between a focusing point of light radiated from the focusing section and the surface of the substrate; and a control section for translating the supporting section in accordance with a result of observation by the observing section to position the substrate with respect to the focusing section.

The apparatus for fabricating a semiconductor thin film according to the embodiment is preferably configured such that the focused light irradiation means forms the growth-mask layer with a desired thickness by controlling the distance between the focusing point of the light radiated from the focusing section and the surface of the substrate, a light intensity, or a translation speed.

The apparatus for fabricating a semiconductor thin film according to the embodiment is preferably configured such that: the focused light irradiation means includes an illuminating light source, provided in a position facing a back surface of the substrate placed on the supporting section, for irradiating, with illumination light from a side facing the back surface of the substrate, a reference point formed on the surface of the substrate; the observing section includes an image pickup element for taking an optical image of the reference point illuminated by the illuminating light source; the image pickup element converts a change in size of the optical image of the reference point into an alternating-current signal, the change being made when the substrate is wobbled in vertical directions at a specific oscillation frequency; and the control section translates the supporting section so that the alternating-current signal takes on a minimum value of amplitude intensity at a frequency corresponding to the specific oscillation frequency, thereby positioning the substrate with respect to the focusing section.

The foregoing configuration makes it possible to automatically position the substrate so that the light radiated from the focusing section is focused on the surface of the substrate.

This makes it possible to determine, with reference to the surface of the substrate, an optimum height of a focusing point of the light radiated from the focusing section.

The apparatus for fabricating a semiconductor thin film according to the embodiment is preferably configured such that the supporting section is composed of a piezodriven translation stage capable of holding constant the distance between the focusing point of the light radiated from the focusing section and the surface of the substrate.

The foregoing configuration makes it possible to suitably realize the supporting section and to translate the substrate stably and accurately.

The apparatus for fabricating a semiconductor thin film according to the embodiment is preferably configured such that the substrate surface treatment means includes: a holding section for holding the substrate; a temperature regulation section for controlling a surface temperature of the substrate; a gas inlet section for adjusting a gaseous atmosphere; and a treatment chamber in which the gas inlet section and the holding section are disposed.

The foregoing configuration makes it possible to suitably realize the substrate surface treatment means.

An apparatus for fabricating a semiconductor thin film according to an embodiment includes substrate surface pretreatment means for surface-treating of a substrate; focused light irradiation means for irradiating, with focused light, the substrate surface-treated by the substrate surface pretreatment means; thin film growth means for selectively growing a semiconductor thin film over an area around a region irradiated with the focused light by the focused light irradiation means; and substrate surface treatment means for modifying the substrate on which the semiconductor thin film has been selectively grown by the thin film growth means.

The foregoing configuration includes focused light irradiation means for irradiating, with focused light, the substrate surface-treated by the substrate surface pretreatment means; thin film growth means for selectively growing a semiconductor thin film over an area around a region irradiated with the focused light by the focused light irradiation means; and substrate surface treatment means for modifying a surface of the substrate on which the semiconductor thin film has been selectively grown by the thin film growth means.

Therefore, the foregoing configuration allows growth of a semiconductor thin film while controlling a mode of growth for each desired region.

The method for fabricating a semiconductor thin film according to the embodiment is preferably configured such that the semiconductor thin films are each a nitride thin film.

The foregoing method makes it possible to form a nitride thin film while controlling a growth condition such as polarity for each desired region. Further, the foregoing method makes it possible to fabricate, for example, a nonlinear optical element having a periodical polarity inverted structure using a nitride thin film.

The method for fabricating a semiconductor thin film according to the embodiment is preferably configured such that the nitride thin film is a GaN film.

The foregoing method makes it possible to form a GaN film while controlling a growth condition such as polarity for each desired region. Further, the foregoing method makes it possible to fabricate, for example, a nonlinear optical element having a periodical polarity inverted structure using a GaN film, thus allowing fabrication of a wavelength conversion device in the mid-infrared region.

The method for fabricating a semiconductor thin film according to the embodiment is preferably configured such that the growth-mask layer is removed by introducing the substrate into a gaseous atmosphere containing hydrogen or ammonia at high temperatures.

The foregoing method makes it possible to suitably remove the growth-mask layer, and can enable or disable the effect of growth-mask during the process of thin film growth.

The method for fabricating a semiconductor thin film according to the embodiment is preferably configured such that the exposed surface of the substrate is modified by introducing the substrate into a gaseous atmosphere containing hydrogen and ammonia at high temperatures.

According to the foregoing method, by introducing the substrate into a gaseous atmosphere containing hydrogen and ammonia at high temperatures, the exposed surface of the substrate can be modified so that a semiconductor thin film is grown under a transformed growth mode.

The method for fabricating a semiconductor thin film according to the embodiment is preferably configured such that the light is light pulses.

The foregoing configuration allows increase in the energy density of incident light per unit time and therefore makes it possible to efficiently form a growth-mask layer.

The method for fabricating a semiconductor thin film according to the embodiment is preferably configured such that the light is laser pulses.

The foregoing configuration makes it possible to efficiently form a growth-mask layer. Further, the foregoing configuration allows formation of a periodic pattern of regions with growth-mask layer using laser-light interference.

The method for fabricating a semiconductor thin film according to the embodiment is preferably configured such that the substrate is a sapphire substrate treated in hydrogen at high temperatures.

The foregoing method allows epitaxial growth of a semiconductor thin film such as a nitride thin film, thus allowing semiconductor thin-film growth while controlling a growth mode for each desired region.

Further, the method for fabricating a semiconductor thin film according to the embodiment is preferably configured such that the growth-mask layer is removed by surface treatment.

The method for fabricating a semiconductor thin film according to the embodiment is preferably configured such that the semiconductor thin films are each grown using a metal organic chemical vapor deposition.

The foregoing method allows the selective growth of a semiconductor thin film using a growth-mask layer containing carbon species and having an effect of suppressing (masking) the growth of a semiconductor thin film, and also allows growth of a semiconductor thin film while controlling a growth mode for each desired region.

The method for fabricating a semiconductor thin film according to the embodiment is preferably configured such that the semiconductor thin films are each a thin film made of a material having a uniaxial crystal structure.

According to the foregoing configuration, since the semiconductor thin films are each a thin film made of a material having a uniaxial crystal structure, a semiconductor thin film with inverted polarity (polarization) can be formed over the modified substrate.

The method for fabricating a semiconductor thin film according to the embodiment is preferably configured such that the growth-mask layer is composed of carbon species.

The foregoing method makes it possible to suitably remove the growth-mask layer, and can enable or disable the effect of growth-mask during the process of thin film growth.

The method for fabricating a semiconductor thin film according to the embodiment is preferably configured such that the organic layer is an organic conducting layer.

The foregoing configuration makes it possible to suitably form a growth-mask layer containing carbon species for each desired region of the surface of the substrate.

A method for selectively growing a semiconductor thin film according to an embodiment includes: coating a substrate with an organic layer; forming a growth-mask layer containing carbon species by irradiating, with focused light, the substrate coated with the organic layer; selectively growing a semiconductor thin film over an area around the growth-mask layer; and removing the growth-mask layer.

According to the foregoing method, the growth-mask layer, which has a growth-mask effect equivalent to that of a growth-mask, can be removed by subsequent surface treatment or the like.

This allows switching between the presence and absence of the growth-mask effect, thus introducing a difference in time of the beginning of thin film growth between a desired region on the substrate and the other.

A semiconductor element according to an embodiment includes a semiconductor thin film fabricated by such a method as described above.

According to the foregoing configuration, by including a semiconductor thin film having its growth mode controlled for each desired region, it is possible to achieve various semiconductor elements such as nonlinear optical elements.

INDUSTRIAL APPLICABILITY

The present invention allows fabrication of, for example, a nonlinear optical medium for use in wavelength conversion, thus allowing application to an optical parametric oscillator, etc. Further, the present invention can also be applied to an optical integrated circuit having such a nonlinear optical medium and an optical waveguide structure or to a biosensor having a channel structure. Furthermore, the present invention can also be applied to the formation of patterns in various semiconductor device structures such as semiconductor laser elements and semiconductor light-emitting elements. Moreover, the present invention can also be applied to a high-electron-mobility transistor whose devices are isolated by forming a polarity-inverted region to divide, between adjacent regions, a heterojunction interface at which a two-dimensional electron gas is formed.

REFERENCE SIGNS LIST

1 Sapphire substrate (substrate)
2 Organic layer
3 Carbon layer (growth-mask layer)
4 GaN film (semiconductor thin film)
4a GaN film with Ga-face (+c) polarity (semiconductor thin film)
4b GaN film with N-face (−c) polarity (semiconductor thin film)
4c Distinct thin film (semiconductor thin film with transformed growth mode)
5 Modified surface
6 Apparatus for fabricating a semiconductor thin film
7 Substrate surface pretreatment means
8 Focused light irradiation means
9 Thin film growth means
10 Substrate surface treatment means
11 Focusing lens
12 Light pulses (light)
12a Laser pulses (light)
13 Reference dot (reference point)
20 Optical integrated circuit
21 Sapphire substrate (substrate)
24 GaN layer
25 Ridge optical waveguide
30 Focusing section
31 Light source
32 Shutter
33 Dichroic mirror
34 Focusing lens
40 Supporting section
41 Stage (piezodriven translation stage)
50 Observing section
51 Mirror
52 Lens
53 Image pickup element
54 Amplifier
55 Light source (illuminating light source)
60 Control section
61 Lock-in amplifier
62 Control PC
63 Supporting section (piezodriven translation stage) driver
64 Oscillator
70 Input section
71 Temperature regulation section
72 Thermometer
73 Temperature control PC
74 Substrate heating mechanism driving section
75 Substrate heating mechanism
76 Gas inlet section
77 Treatment chamber
78 Holding section
100 Apparatus for fabricating a semiconductor thin film
101 Substrate surface pretreatment means
102 Organic layer coating means
103 Focused light irradiation means
104 First thin film growth means
105 Substrate surface treatment means
106 Second thin film growth means

The invention claimed is:

1. A method for fabricating a semiconductor thin film, comprising:
   coating a substrate with an organic layer;
   forming a growth-mask layer containing carbon species by irradiating, with focused light, the substrate coated with the organic layer;
   selectively growing a semiconductor thin film over an area around the growth-mask layer;
   exposing a surface of the substrate by removing the growth-mask layer;
   modifying the exposed surface of the substrate; and
   further growing the semiconductor thin film and growing a semiconductor thin film over the modified surface of the substrate.

2. The method as set forth in claim 1, wherein the semiconductor thin films are each a nitride thin film.

3. The method as set forth in claim 1, wherein the growth-mask layer is removed by introducing the substrate into a gaseous atmosphere containing hydrogen or ammonia in a high-temperature environment.

4. The method as set forth in claim 1, wherein the exposed surface of the substrate is modified by introducing the substrate into a gaseous atmosphere containing hydrogen and ammonia in a high-temperature environment.

5. The method as set forth in claim 1, wherein the light is laser pulses.

6. The method as set forth in claim 1, wherein the substrate is a sapphire substrate treated in hydrogen at high temperatures.

7. The method as set forth in claim 1, wherein the semiconductor thin films are each grown by metal organic chemical vapor deposition.

8. A semiconductor element comprising a semiconductor thin film fabricated by a method as set forth in claim 1.

9. A method for selectively growing a semiconductor thin film, comprising:
   coating a substrate with an organic layer;
   forming a growth-mask layer containing carbon species by irradiating, with focused light, the substrate coated with the organic layer;
   selectively growing a semiconductor thin film over an area around the growth-mask layer; and
   removing the growth-mask layer.

* * * * *